(12) United States Patent
Okigawa et al.

(10) Patent No.: US 10,396,308 B2
(45) Date of Patent: Aug. 27, 2019

(54) ORGANIC EL DISPLAY PANEL

(71) Applicant: JOLED INC., Tokyo (JP)

(72) Inventors: Akifumi Okigawa, Tokyo (JP); Kenji Harada, Tokyo (JP); Keiji Horikawa, Tokyo (JP); Masaya Terai, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/006,908

(22) Filed: Jun. 13, 2018

(65) Prior Publication Data
US 2018/0366680 A1 Dec. 20, 2018

(30) Foreign Application Priority Data

Jun. 14, 2017 (JP) .................... 2017-117270

(51) Int. Cl.
*H01L 35/24* (2006.01)
*H01L 51/52* (2006.01)
*H01L 27/32* (2006.01)
*H01L 51/56* (2006.01)
*H01L 51/00* (2006.01)

(52) U.S. Cl.
CPC ...... *H01L 51/5246* (2013.01); *H01L 27/3276* (2013.01); *H01L 51/0097* (2013.01); *H01L 51/56* (2013.01); *H01L 2227/323* (2013.01); *H01L 2251/5338* (2013.01)

(58) Field of Classification Search
CPC ............. H01L 27/3276; H01L 51/0097; H01L 51/56; H01L 2227/323
See application file for complete search history.

(56) References Cited

U.S. PATENT DOCUMENTS

| | | | |
|---|---|---|---|
| 5,443,922 A | 8/1995 | Nishizaki et al. | |
| 9,343,700 B2 | 5/2016 | Cho et al. | |
| 9,391,296 B2 | 7/2016 | Park et al. | |
| 2003/0164677 A1 | 9/2003 | Miyaguchi et al. | |
| 2009/0128017 A1 | 5/2009 | Sagawa et al. | |
| 2015/0048326 A1 | 2/2015 | Cho et al. | |
| 2015/0060806 A1 | 3/2015 | Park et al. | |

FOREIGN PATENT DOCUMENTS

| | | |
|---|---|---|
| JP | H5-163488 A | 6/1993 |
| JP | 2000-223264 A | 8/2000 |
| JP | 2009-123538 A | 6/2009 |

*Primary Examiner* — Samuel A Gebremariam
(74) *Attorney, Agent, or Firm* — Hauptman Ham, LLP

(57) ABSTRACT

An organic electroluminescence (EL) display panel includes a multi-layered wiring laminate disposed on a substrate and including insulating layers and wiring disposed on at least one of the insulating layers and extending to a vicinity of an outer periphery of the wiring laminate; an organic EL element array disposed on the wiring laminate; a first inorganic insulating layer disposed on the array and extending outside the outer periphery of the wiring laminate in plan view; a resin sealing layer disposed on the first inorganic insulating layer, covering the array in plan view, and having an outer periphery above a resin insulating layer that is a highest layer among the insulating layers; a second inorganic insulating layer disposed on the resin sealing layer, extending outside the outer periphery of the resin sealing layer in plan view, and being in contact with the first inorganic insulating layer in a thickness direction.

9 Claims, 16 Drawing Sheets

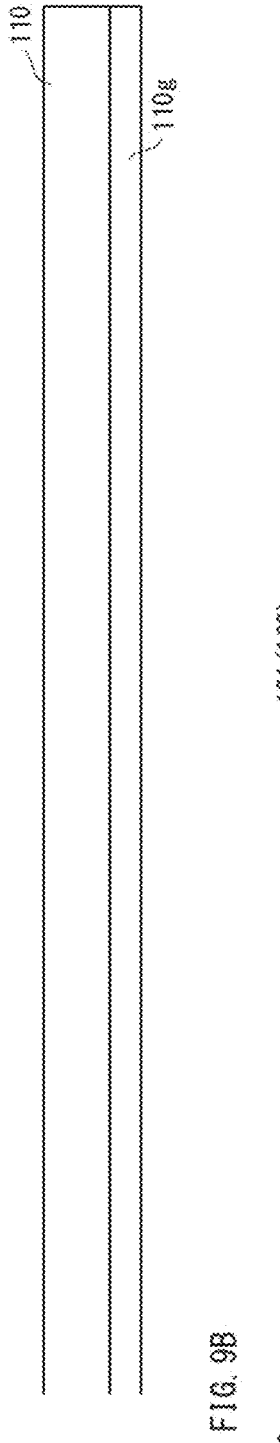
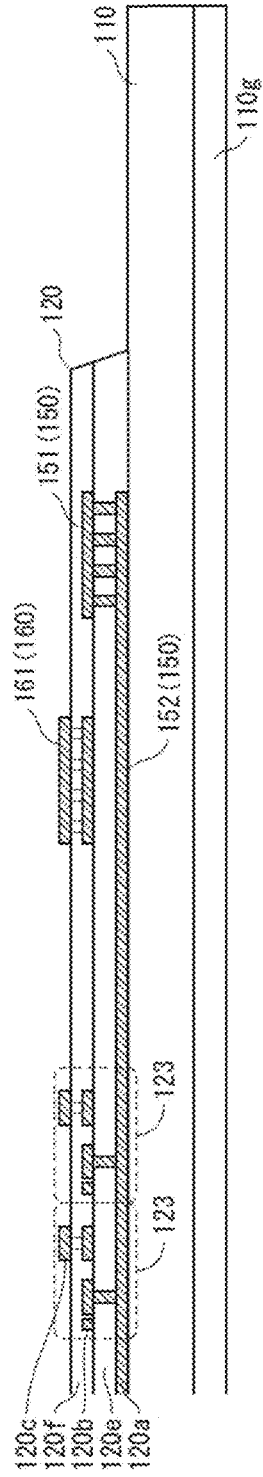
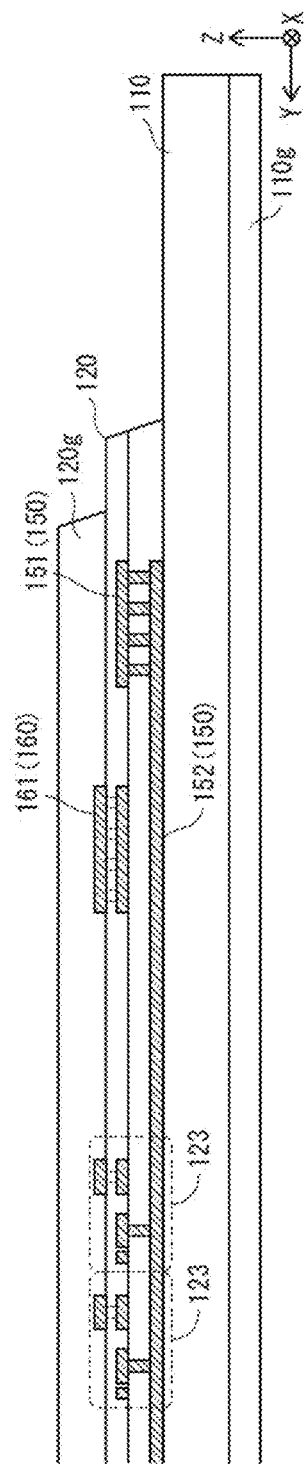

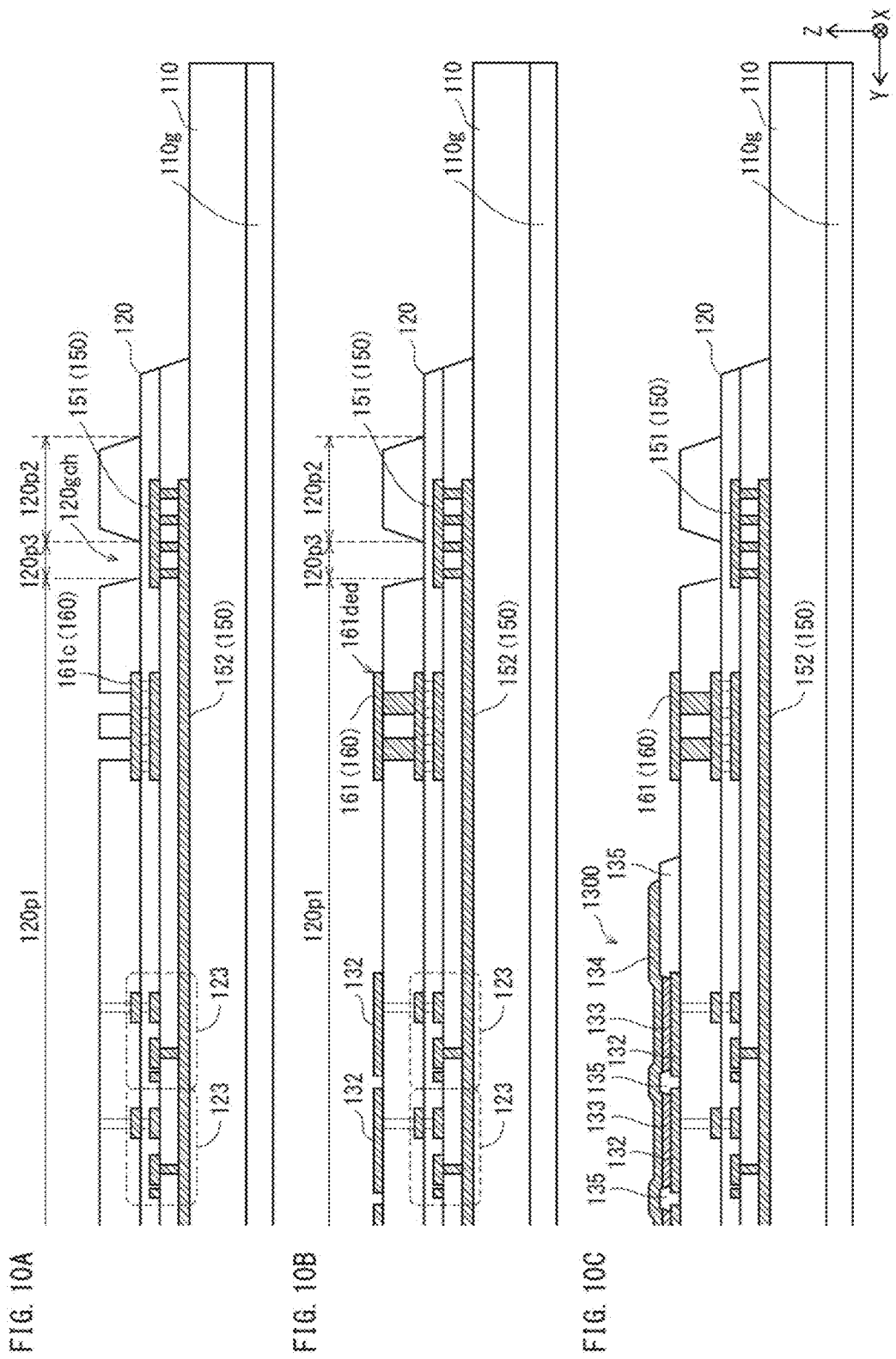

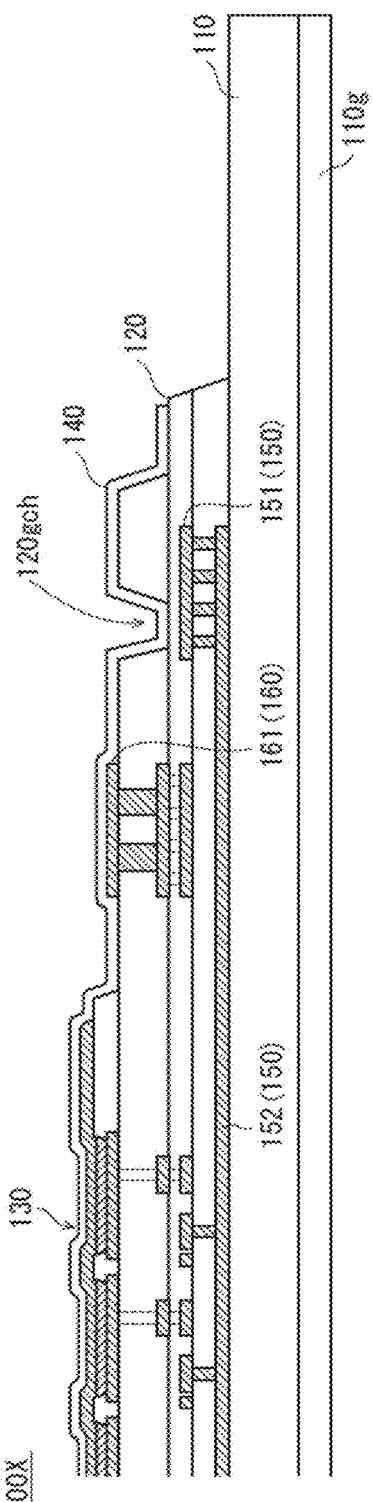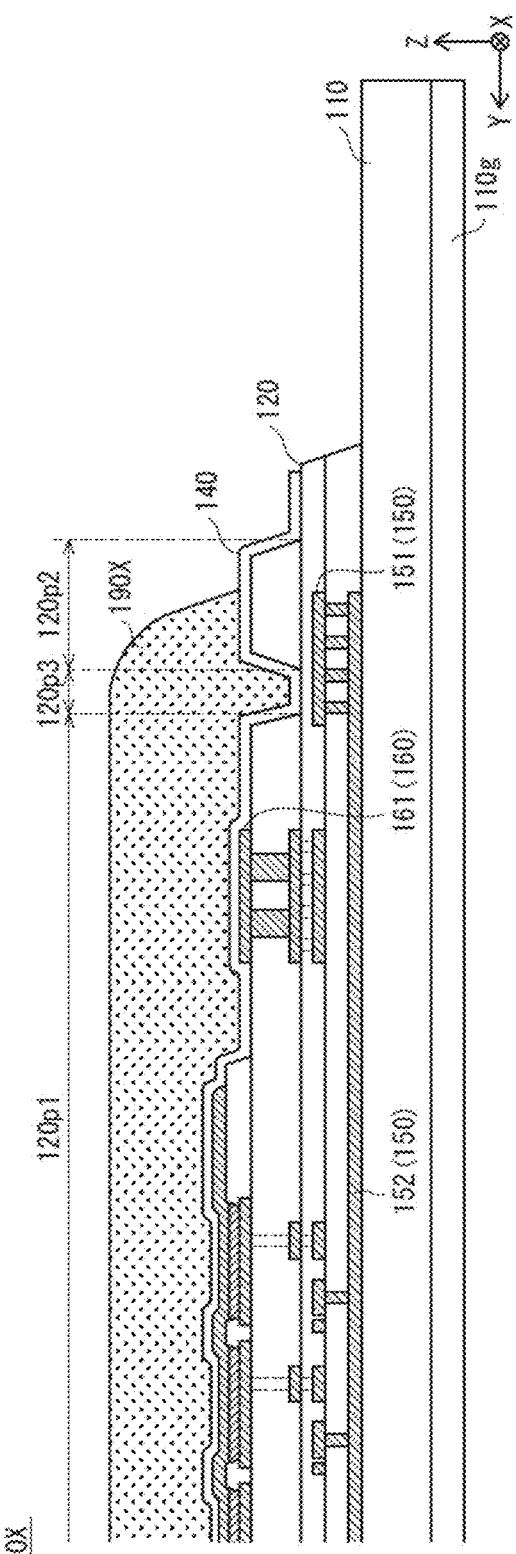

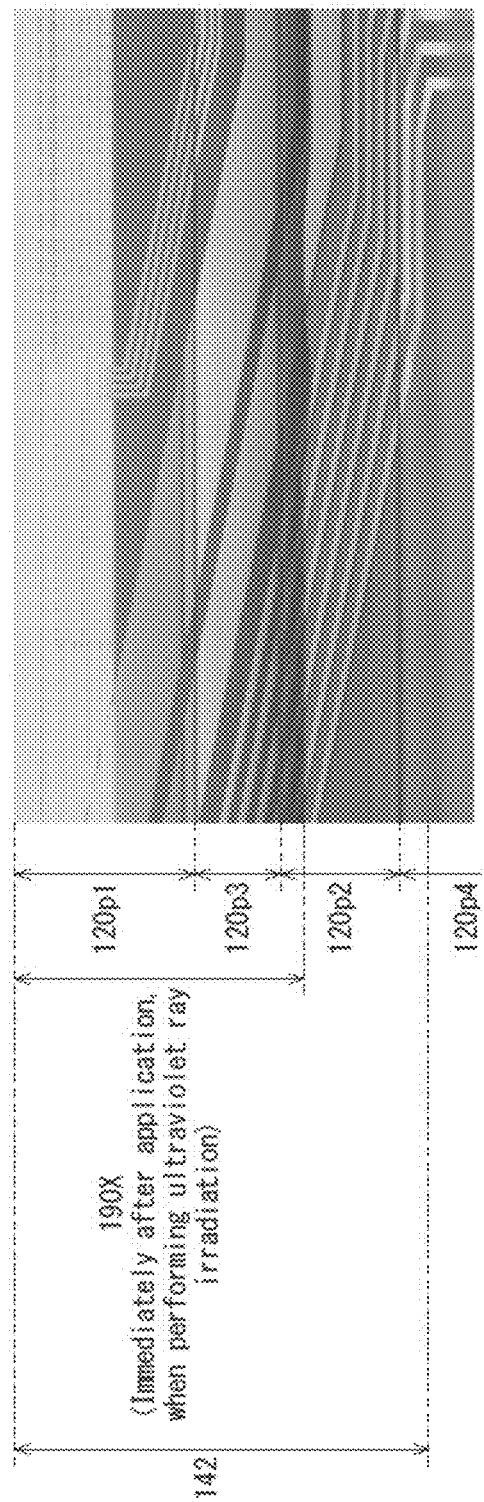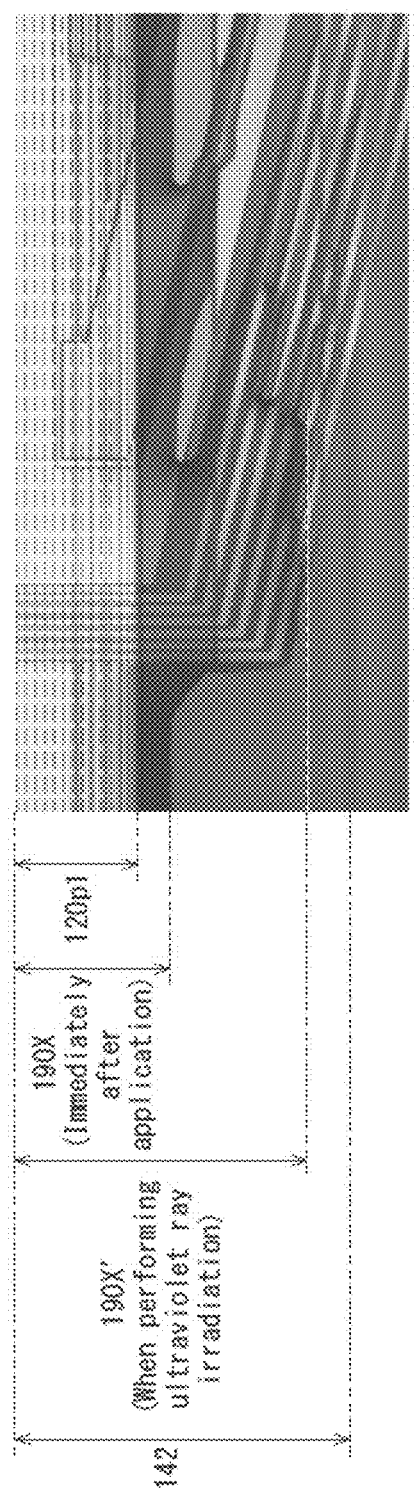

ORGANIC EL DISPLAY PANEL

This application claims priority to Japanese Patent Application No. 2017-117270 filed Jun. 14, 2017, the contents of which are hereby incorporated by reference in its entirety.

BACKGROUND

Technical Field

The present disclosure relates to organic electroluminescence (EL) display panels including a plurality of organic EL elements, and in particular to a sealing technology for helping to suppress penetration of moisture from the surrounding environment.

Description of Related Art

Organic EL panels including a plurality of organic EL elements are conventionally known. An organic EL element has a multi-layered structure including a laminate of thin films of various materials, and includes at least a pixel electrode, a common electrode, and an organic light-emitting layer sandwiched between the pixel electrode and the common electrode on a thin film transistor (TFT) substrate covered by a planarization insulating layer. As necessary, a hole injection layer, a hole transport layer, an electron injection layer, an electron transport layer, or the like is disposed between the pixel electrode and the organic light-emitting layer or between the common electrode and the organic light-emitting layer. These layers may include a material whose light-emitting quality deteriorates when reacting with moisture. In order to help to suppress deterioration of display quality of organic EL display panels over time, a sealing technology for suppressing penetration of moisture from the surrounding environment is important.

In view of this, for example, US2015-0048326 proposes a flexible display device in which an organic EL element array including a plurality of organic EL elements is arranged on a flexible substrate. In this flexible display panel, a plurality of insulating layers made of an inorganic material and a plurality of insulating layers made of an organic material are laminated alternatingly to cover the organic EL element array. US2015-0048326 describes that such a structure of this display device helps to prevent oxygen or moisture from penetrating from outside into a display region.

SUMMARY

An organic EL display panel pertaining to at least one aspect of the present disclosure includes a substrate. The organic EL display panel further includes a multi-layered wiring laminate disposed on the substrate and including wiring and a plurality of insulating layers, the wiring disposed on at least one of the insulating layers and extending to a vicinity of an outer periphery of the multi-layered wiring laminate. The organic EL display panel further includes an organic EL element array disposed on the multi-layered wiring laminate and including organic EL elements that are connected to the wiring. The organic EL display panel further includes a first inorganic insulating layer disposed at least on the organic EL element array and extending outside the outer periphery of the multi-layered wiring laminate in plan view. The organic EL display panel further includes a resin sealing layer disposed on the first inorganic insulating layer, the resin sealing layer covering the organic EL element array in plan view and having an outer periphery above a resin insulating layer that is a highest layer among the insulating layers. The organic EL display panel further includes a second inorganic insulating layer disposed at least on the resin sealing layer, the second inorganic insulating layer extending outside the outer periphery of the resin sealing layer in plan view and being in contact with the first inorganic insulating layer in a thickness direction.

BRIEF DESCRIPTION OF THE DRAWINGS

The advantages and features of the technology pertaining to the present disclosure will become apparent from the following description thereof taken in conjunction with the accompanying drawings, which illustrate at least one embodiment of the technology pertaining to the present disclosure.

FIG. 9A, FIG. 9B, and FIG. 9C are cross-sectional views of processes of manufacturing the display panel 100 pertaining to at least one embodiment, taken along line Y1-Y1 in FIG. 3 and FIG. 4.

FIG. 10A, FIG. 10B, and FIG. 10C are cross-sectional views of processes of manufacturing the display panel 100 pertaining to at least one embodiment, taken along line Y1-Y1 in FIG. 3 and FIG. 4.

FIG. 11A and FIG. 11B are cross-sectional views of processes of manufacturing the display panel 100 pertaining to at least one embodiment, taken along line Y1-Y1 in FIG. 3 and FIG. 4.

FIG. 14A is a photograph of the multi-layered wiring laminate 120 in the peripheral region of a working example of the display panel 100 pertaining to at least one embodiment, seen from an upper surface of an inorganic insulating layer 140 on the multi-layered wiring laminate. FIG. 14B is a photograph of a multi-layered wiring laminate 120 in the peripheral region of the display panel 100Y pertaining to the comparative example, seen from an upper surface of the inorganic insulating layer 140 on the multi-layered wiring laminate.

DETAILED DESCRIPTION

Figure 1A:
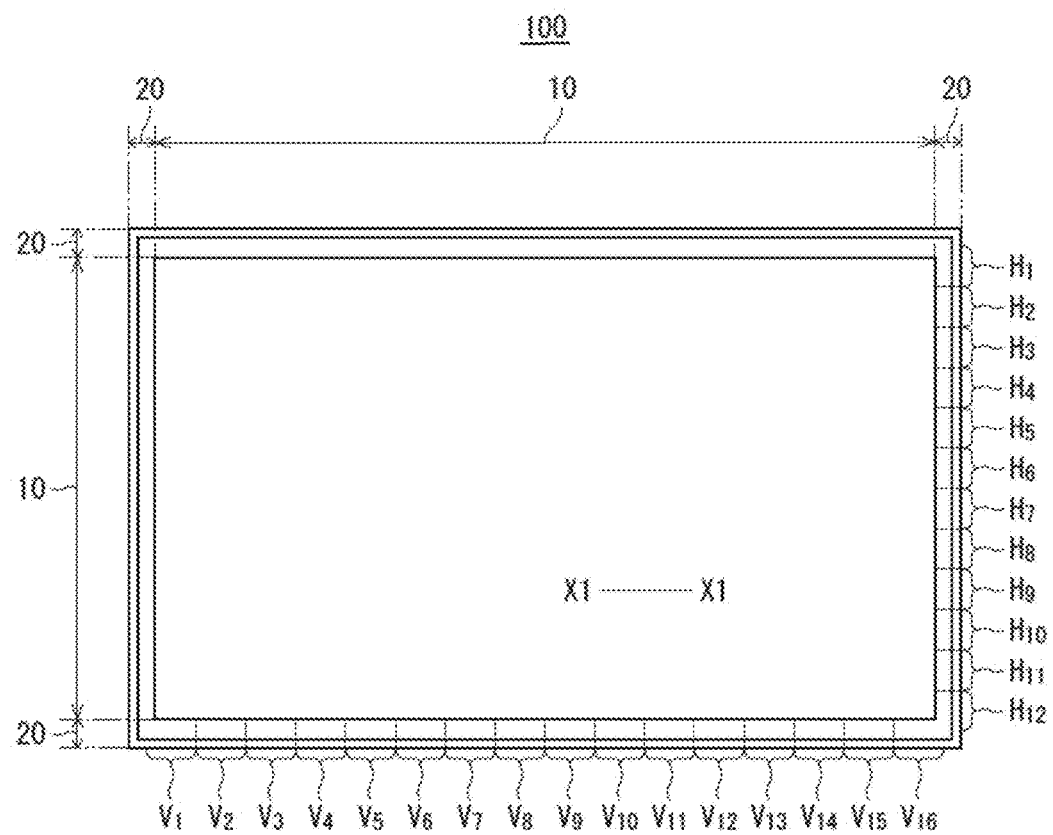
FIG. 1A is a layout in plan view of an organic EL display panel 100 pertaining to at least one embodiment.

Circumstances Leading to Embodiment of Present Disclosure

Typically, when an insulating layer made of an organic material is formed in manufacture of a display panel, a resin material in an uncured state is applied by, for example, dispensing, screen printing, or inkjets, and a curing process is performed. Because a resin application material in an uncured state has low viscosity, the resin material may flow out immediately after application. In such cases, an outer periphery of the resin material which has flowed out may hinder coverage by a subsequent inorganic insulating layer, and thus the display panel may fail to have sufficient sealing property. In view of this, for example, US2015-0060806 proposes a technology of forming a plurality of dams of insulating layers in a peripheral region on the substrate to suppress and dam the flow of the resin material. However, this technology causes enlargement of the peripheral region due to including a plurality of dams, and contradicts the demand for frame size narrowing.

A typical organic EL display panel includes, between a substrate and an organic EL element array, a multi-layered wiring laminate for supplying signals and electricity from outside to organic EL elements. For example, the multi-layered wiring laminate includes wiring connected to drive circuits and a common electrode of the organic EL elements. In plan view of the organic EL display panel, the wiring extends from a display region in which the organic EL element array is disposed to a region surrounding the display region and connect to an external drive circuit (for example, see JP2009-123538). Consequently, convex portions are observed on a surface of the multi-layered wiring laminate due to patterns of wiring layers. Consideration by the inventors revealed that, when a resin material is applied on the surface of such a multi-layered wiring laminate, the resin material may flow out along the patterns of the convex portions before the curing process is performed.

The present disclosure has been achieved in view of the above problems, and an aim thereof is to provide a display panel that has a structure for helping to prevent a resin material for covering the organic EL light-emitting element array from flowing out immediately after application and thus to improve sealing property.

Overview of Embodiment of Present Disclosure

An organic EL display panel pertaining to at least one aspect of the present disclosure includes a substrate. The organic EL display panel further includes a multi-layered wiring laminate disposed on the substrate and including wiring and a plurality of insulating layers, the wiring disposed on at least one of the insulating layers and extending to a vicinity of an outer periphery of the multi-layered wiring laminate. The organic EL display panel further includes an organic EL element array disposed on the multi-layered wiring laminate and including organic EL elements that are connected to the wiring. The organic EL display panel further includes a first inorganic insulating layer disposed at least on the organic EL element array and extending outside the outer periphery of the multi-layered wiring laminate in plan view. The organic EL display panel further includes a resin sealing layer disposed on the first inorganic insulating layer, the resin sealing layer covering the organic EL element array in plan view and having an outer periphery above a resin insulating layer that is a highest layer among the insulating layers. The organic EL display panel further includes a second inorganic insulating layer disposed at least on the resin sealing layer, the second inorganic insulating layer extending outside the outer periphery of the resin sealing layer in plan view and being in contact with the first inorganic insulating layer in a thickness direction.

This helps to achieve a structure in which a resin material for covering the organic EL light-emitting element array is prevented from flowing out immediately after application and thus helps to improve sealing property of the organic EL display panel.

Further, even when a first inorganic insulating layer or a second inorganic insulating layer having a film flaw is formed during forming due to a foreign material in a lower layer, the double-layered structure in which the first inorganic insulating layer and the second inorganic insulating layer are laminated helps to prevent moisture penetration from outside. Due to including a laminate of the first inorganic insulating layer and the second inorganic insulating layer, which are not formed at the same time, even when one of these two layers has a film flaw, the other of the two layers helps to maintain sealing property of the display panel 100.

According to at least one embodiment of the organic EL display panel, the second inorganic insulating layer extends outside the outer periphery of the multi-layered wiring laminate in plan view and is in contact with the first inorganic insulating layer above the substrate.

This structure helps to prevent moisture from penetrating into the resin sealing layer and the resin insulating layer, which are organic layers.

According to at least one embodiment of the organic EL display panel, the multi-layered wiring laminate includes: a first part on which the organic EL element array is disposed and in which a first portion of the resin insulating layer is present; a second part that surrounds the first part in plan view and in which a second portion of the resin insulating layer having a bank-shape is present; a third part that is between the first part and the second part in plan view and that has a shape of a circumferential groove in which the resin insulating layer is not present; and a fourth part that surrounds the second part and in which the resin insulating layer is not present. The wiring extends from the first part to the fourth part in plan view, the outer periphery of the resin sealing layer being in the second part in plan view, and the first inorganic insulating layer and the second inorganic insulating layer extending to the fourth part in plan view and being in contact with each other outside the outer periphery of the resin sealing layer.

According to this structure, in plan view, the circumferential groove portion, which is inside the second part, helps to prevent moisture from penetrating into a region inside the circumferential groove portion. Accordingly, moisture would not penetrate into the display region. That is, sealing property of the display panel can further be improved because the display panel has no portion inside the circumferential groove portion in plan view in which the first inorganic insulating layer and the second inorganic insulating layer directly overlap with each other.

According to at least one embodiment of the organic EL display panel, the multi-layered wiring laminate further includes: a fifth part that is not covered by the resin insulating layer, the fifth part surrounding the first part and being inside the third part in plan view; and a sixth part that is covered by the resin insulating layer, the sixth part surrounding the fifth part and being surrounded by the third part in plan view.

Because the peripheral region portion is provided with two circumferential groove portions, even when moisture penetrates from a substrate outer peripheral direction into an interlayer insulating layer inside an outer circumferential groove portion in plan view (sixth part), moisture is prevented from penetrating into a region inside an inner circumferential groove portion in plan view, and thus can be prevented from penetrating into the display region portion.

At least one embodiment of the organic EL display panel further includes a second resin sealing layer, the first inorganic insulating layer including an upper layer and a lower layer, the second resin sealing layer being disposed between the upper layer and the lower layer above the organic EL element array in the first part of the multi-layered wiring laminate.

Even when a first inorganic insulating layer, a second inorganic insulating layer, or a third inorganic insulating layer having a film flaw is formed due to a foreign material in a lower layer, the triple-layered structure in which the first inorganic insulating layer, the second inorganic insulating layer, and the third inorganic insulating layer are laminated helps to prevent moisture penetration from outside. Due to laminating of the first inorganic insulating layer, the second inorganic insulating layer, and the third inorganic insulating layer, which are not formed at the same time, even when one of these three layers has a film flaw, the other two of the three layers help to maintain sealing property of the display panel 100.

According to at least one embodiment of the organic EL display panel, the organic EL elements each include: a light-emitting unit that includes a pixel electrode, a common electrode opposing the pixel electrode, and an organic light-emitting layer sandwiched between the pixel electrode and the common electrode; and a transistor that is connected to the pixel electrode and that drives the light-emitting unit, the wiring being connected to: the common electrode; or sources, drains, gates, or power lines of the transistors of the organic EL elements.

According to at least one embodiment of the organic EL display panel, in the first part of the multi-layered wiring laminate, the first inorganic insulating layer covers the organic EL element array, the wiring, and the resin insulating layer.

Even when moisture penetrates from outside into the resin sealing layer, this structure helps to prevent such moisture from penetrating into the display region, in which the organic EL elements are arranged.

According to at least one embodiment of the organic EL display panel, the substrate is a film including a flexible material. According to at least one embodiment of the organic EL display panel, the substrate is light-transmissive.

This structure helps to achieve a flexible display having improved sealing property by helping to prevent flowing-out of a resin material covering the organic EL element array.

The following describes a display panel pertaining to at least one embodiment of the present disclosure, with reference to the drawings.

Embodiment

1. Structure of Display Panel
1.1. Overview of Structure

Figure 1B:
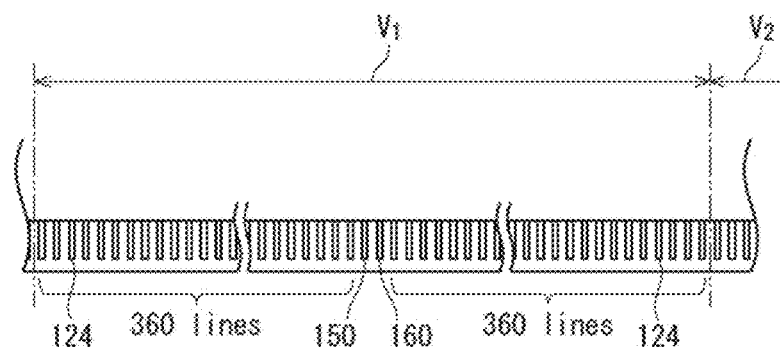
FIG. 1B is an enlarged view of a divisional region of the organic EL display panel 100 pertaining to at least one embodiment.

FIG. 1A is a layout in plan view of an organic EL display panel 100 pertaining to at least one embodiment, and FIG. 1B is an enlarged view of a divisional region of the organic EL display panel 100 pertaining to at least one embodiment. The organic EL display panel 100 (hereinafter referred to as "display panel 100") has, in plan view, a display region 10 and a peripheral region 20 surrounding the display region 10.

In the display region 10, a plurality of pixels are arranged in a matrix. For example, when the display panel 100 is a panel having resolution of 4K, 3840 pixels are arranged along a horizontal line and 2160 pixels are arranged along a vertical line. The pixels each include a plurality of subpixels of different colors. In the present embodiment, the pixels each include a red subpixel, a green subpixel, and a blue subpixel. Each subpixel corresponds to an organic EL element.

The peripheral region 20 has a shape of a rectangular frame, and has divisional regions V1 through V16 along the longer side of the peripheral region 20 and divisional regions H1 through H12 along the shorter side of the peripheral region 20. The divisional regions V1 through V16 and H1 through H12 are each a region electrically connected to an external drive circuit.

FIG. 1B is an enlarged view of the divisional region V1. In the divisional region V1, a first power supply line 150, a second power supply line 160 to which a voltage differing from a voltage applied to the first power supply line 150 is applied, and a plurality of data signal lines 124 are arranged.

The divisional regions V2 through V16 each have a structure similar to the structure of the divisional region V1, and in each of the divisional regions V, the first power supply line 150 and the second power supply line 160 supply electricity to organic EL elements of the pixels arrayed along a plurality of vertical lines.

The data signal lines 124 transmit voltage signals corresponding to luminances of the organic EL elements, to which electricity is supplied from the first power supply line 150 and the second power supply line 160.

The divisional regions H1 through H12 have a structure similar to the divisional regions V1 through V16, differing only with respect to the kinds of lines therein. Specifically, the divisional regions H1 through H12 each include a plurality of scan signal lines that transmit selection signals for selecting one of horizontal lines in the display region 10.

Luminances of the organic EL elements are set by selecting one of the horizontal lines by a selection signal transmitted by one of the scan signal lines and transmitting, through each of the data signal lines 124 to a corresponding one of the organic EL elements in the selected one of the horizontal lines, a voltage signal corresponding to the corresponding one of the organic EL elements. Due to this structure, the data signal lines 124 and the scan signal lines serve as signal lines transmitting signals for setting luminances of the organic EL elements.

1.2. Circuit Structure

Figure 2:
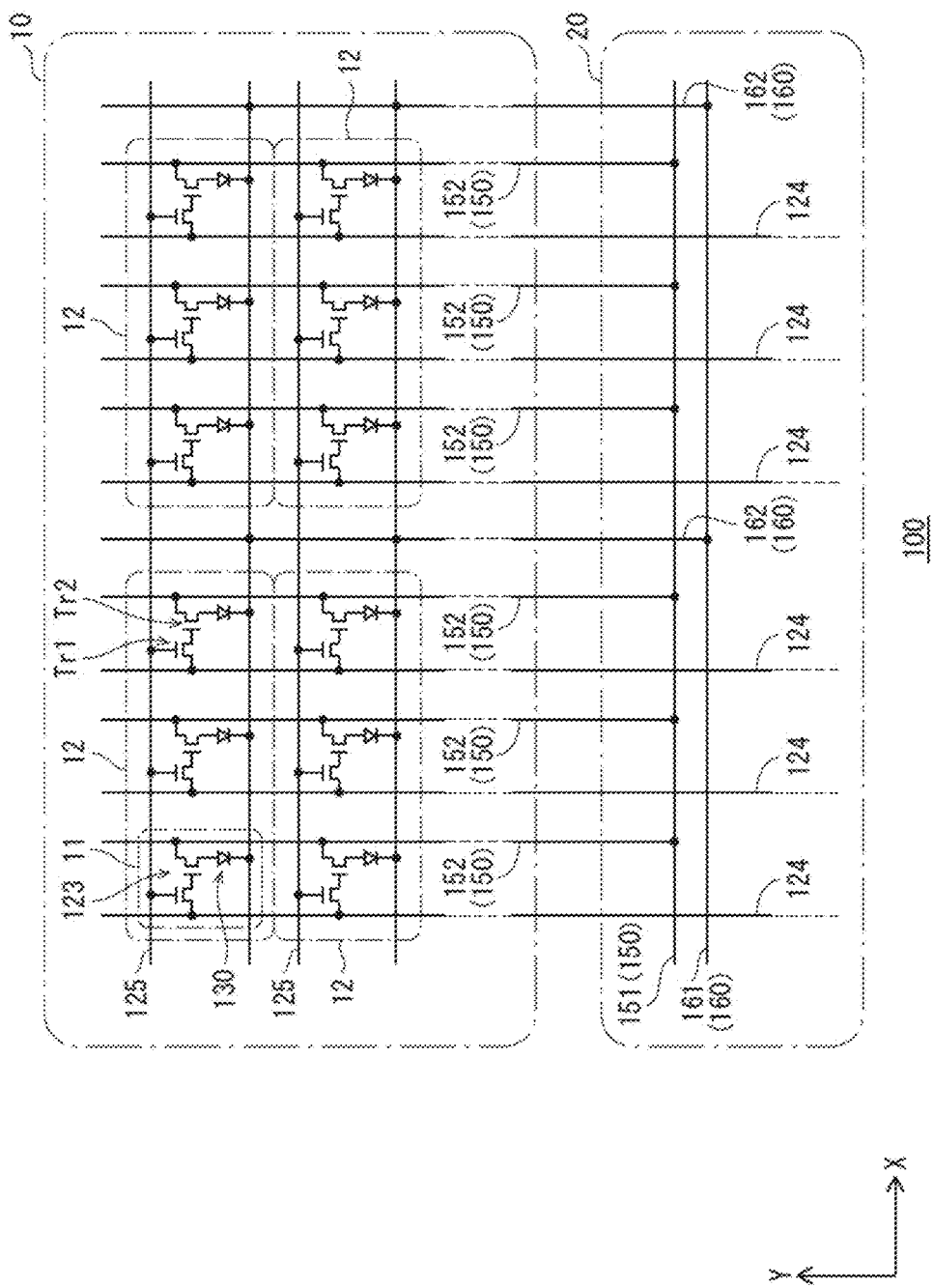
FIG. 2 is a circuit diagram of the display panel 100 pertaining to at least one embodiment.

FIG. 2 is a circuit diagram of the display panel 100 pertaining to at least one embodiment. The display panel 100 has a plurality of pixels 12 arrayed in a horizontal direction (X direction in FIG. 2) and a vertical direction (Y direction in FIG. 2). In the present embodiment, the pixels 12 are each composed of three subpixels 11 arrayed along the horizontal direction. The subpixels 11 each include an organic EL element 130 and a subpixel drive circuit 123 that is composed of thin film transistors $Tr_2$ and $Tr_1$ that are connected to the organic EL element 130.

The display panel 100 further includes the data signal lines 124 that extend in the vertical direction and the scan signal lines 125 that extend in the horizontal direction. The data signal lines 124 and the scan signal lines 125 transmit signals for causing the organic EL elements 130 to each emit a desired luminance. Because the data signal lines 124 and the scan signal lines 125 are known, explanations thereof are not provided here.

The display panel 100 further includes the first power supply line 150 and the second power supply line 160. The first power supply line 150 includes a trunk line 151 and a plurality of branch lines 152 connected to the trunk line 151. The second power supply line 160 includes a trunk line 161 and a plurality of branch lines 162 connected to the trunk line 161. In FIG. 2, the trunk line 151 and the trunk line 161 each extend in the horizontal direction in the peripheral region 20 of the display panel 100, and the branch lines 152 and the branch lines 162 each extend in the vertical direction in the display region 10 of the display panel 100. Note that the trunk lines 151 and 161 extend in the horizontal direction because FIG. 2 illustrates a portion of the peripheral region 20 extending in the horizontal direction. In portions of peripheral region 20 extending in the vertical direction (Y direction), the trunk line 151 and the trunk line 161 extend in the vertical direction.

In the present embodiment, the first power supply line 150 is connected through the thin film transistor $Tr_2$ to anodes of the organic EL elements 130, and the second power supply line 160 is connected to a cathode of the organic EL elements 130. To the first power supply line 150, a first voltage (for example, 20 V) is applied, and to the second power supply line 160, a second voltage differing from the first voltage (for example, 0 V) is applied.

1.3. Structure of Display Region

Figure 3:
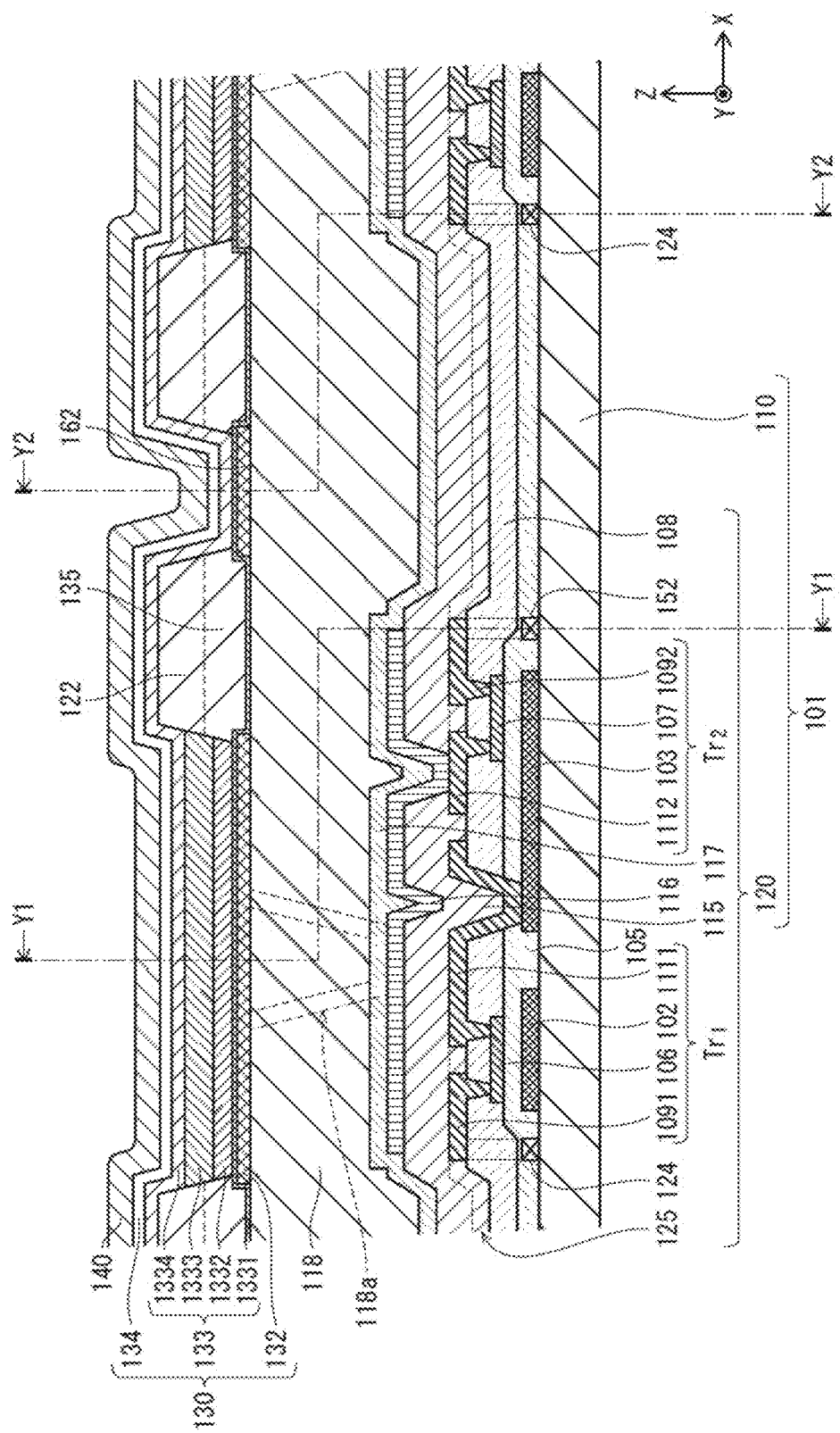
FIG. 3 is a partial cross-sectional view of a display region of the display panel 100 pertaining to at least one embodiment, taken along line X1-X1 in FIG. 1.

FIG. 3 is a partial cross-sectional view of the display region of the display panel 100 pertaining to at least one embodiment, taken along line X1-X1 in FIG. 1. The display region 10 of the display panel 100 includes a multi-layered wiring laminate 120 and the organic EL elements 130 that are laminated on a substrate 110 in this order. In FIG. 3, only a region corresponding to an organic EL element included in a subpixel is shown.

1.3.1. Substrate

The substrate 110 is made of an inorganic material or an organic material. For example, the substrate 110 is made of an electrically-insulating material such as alkali-free glass, soda glass, nonfluorescent glass, phosphate glass, borate glass, quartz, alumina, or the like.

Alternatively, an organic resin film can be used. Such a resin material can be acrylic resin, styrenic resin, polycarbonate resin, epoxy resin, polyethylene, polyester, silicone resin, or the like, and thermoplastic resin or thermosetting resin may be used. The film may be made of a flexible material. Further, the film may be light-transmissive. Specifically, the substrate 110 can be made by using a resin material such as: polyimide, polyimidebenzoxazole, poly- imidebenzimidazole, or other copolymers containing polyimide as a unit structure; polyolefin such as polyester, polytetrafluoroethylene, polyphenylene sulfide, polyamide, polyamideimide, polycarbonate, polystyrene, polypropylene, polyethylene, polyvinyl chloride, polyether sulfone, polyethylene naphthalene, an ethylene-propylene copolymer, an ethylene-vinyl acetate copolymer; cyclic polyolefin; modified polyolefin; polyvinyl chloride; polyvinylidene chloride; acrylic resin; polymethyl methacrylate; an acrylic-styrene copolymer; a butadiene-styrene copolymer; an ethylene vinyl alcohol copolymer; polyether; polyether ketone; polyether ether ketone; polyether imide; polyacetal; polyphenylene oxide; modified polyphenylene oxide; polyarylate; aromatic polyester; polytetrafluoroethylene, polyvinylidene fluoride, or the like. Alternatively, the substrate 110 may have a multi-layered structure of layers each including one or more of the above-described materials. In the present embodiment, a film made of polyimide is used.

1.3.2. Multi-Layered Wiring Laminate

Gate electrodes 102 and gate electrodes 103 that are spaced away from each other are disposed on the substrate 110. The gate electrodes 102 and 103 are made of, for example, aluminum, an aluminum alloy, copper, or a copper alloy. The gate electrodes 102 and 103 may have a single-layered structure of one of an aluminum layer, an aluminum alloy layer, a copper layer, and a copper alloy layer, or may each be a laminate including at least one of these layers and another metal layer. For example, the gate electrodes 102 and 103 may be a laminate of a copper layer and a titanium layer, a laminate of a copper layer and a molybdenum layer, or a laminate of an aluminum layer and a titanium layer.

Further, the data signal lines 124 and the branch lines 152 of the first power supply line 150 are disposed on the substrate 110. The data signal lines 124 extend in a vertical line direction of the display panel 100 to the peripheral region 20. Each of the data signal lines 124 is electrically connected through contact holes to drain electrodes 1091 of the organic EL elements 130 in all the subpixels that belong to the same vertical line as the data signal line 124, which are of the same color.

The branch lines 152 of the first power supply line 150 extend in the vertical line direction of the display panel 100 to the peripheral region 20. Each of the branch lines 152 is electrically connected through contact holes to drain electrodes 1092 of the organic EL elements 130 in all the subpixels that belong to the same vertical line as the branch line 152, which are of the same color.

Surfaces of the gate electrodes 102 and 103, the data signal lines 124, the branch lines 152 of the first power supply line 150, and the substrate 110 are covered by a gate insulating layer 105. The gate insulating layer 105 is made of a known gate insulating material such as silicon oxide (SiO) or the like.

Channel layers 106 are disposed on portions of the gate insulating layer 105 that correspond to the gate electrodes 102. Further, on portions of the gate insulating layer 105 that correspond to the gate electrodes 103, channel layers 107 are disposed.

Surfaces of the channel layers 106, the channel layers 107, and the gate insulating layer 105 are covered by a channel inorganic insulating layer 108.

The drain electrodes 1091, the drain electrodes 1092, source electrodes 1111, and source electrodes 1112 are disposed on the channel inorganic insulating layer 108. The drain electrodes 1091 and the source electrodes 1111 are electrically connected to the channel layers 106 through contact holes that pass through the channel inorganic insulating layer 108. The drain electrodes 1092 and the source electrodes 1112 are electrically connected to the channel layers 107 through contact holes that pass through the channel inorganic insulating layer 108. The drain electrodes 1091, the drain electrodes 1092, the source electrodes 1111, and the source electrodes 1112 are made of tungsten, molybdenum tungsten, vanadium, ruthenium, gold, or copper, or an alloy thereof.

Further, on the channel inorganic insulating layer 108, the scan signal lines 125 are disposed. The scan signal lines 125 extend in a horizontal line direction of the display panel 100 to the peripheral region 20. Each of the scan signal lines 125 is electrically connected through contact holes to the gate electrodes 102 of the organic EL elements 130 in all the subpixels that belong to the same horizontal line as the scan signal line 125.

A lower passivation layer 115 covers the drain electrodes 1091, the drain electrodes 1092, the source electrodes 1111, the source electrodes 1112, the scan signal lines 125, and the channel inorganic insulating layer 108. The lower passivation layer 115 is made of an inorganic material such as silicon oxide (SiO) or the like. The lower passivation layer 115 has contact holes above the source electrodes 1112.

Connection electrodes 116 are disposed to extend along side walls of the contact holes. The connection electrodes 116 have lower portions electrically connected to the source electrodes 1112 and upper portions present on the lower passivation layer 115. The connection electrodes 116 may be made of the same material as the source electrodes 1112.

An upper passivation layer 117 covers surfaces of the connection electrodes 116 and the lower passivation layer 115. On the upper passivation layer 117, a planarization layer 118 (interlayer insulating layer 120g) is disposed. The planarization layer 118 has a function of compensating for surface unevenness caused by wiring of the multi-layered wiring laminate and achieving surface planarization. The planarization layer 118 is made of an electrically-insulating material such as polyimide resin, acrylic resin, or the like. The planarization layer 118 preferably has a thickness from 3 μm to 10 μm, and more preferably has a thickness from 3 μm to 4 μm.

The upper passivation layer 117 and the planarization layer 118 have contact holes 118a. The connection electrodes 116 are exposed by the contact holes 118a.

On the planarization layer 118, the branch lines 162 of the second power supply line 160 are disposed. The branch lines 162 extend in the vertical line direction of the display panel 100, and a branch line 162 is provided for every three subpixels arrayed in the horizontal line direction.

In the multi-layered wiring laminate 120 having the structure described above, a gate electrode 102, the gate insulating layer 105, a channel layer 106, a drain electrode 1091, and a source electrode 1111 are included in a thin film transistor $Tr_1$ of a subpixel drive circuit 123. Further, a gate electrode 103, the gate insulating layer 105, a channel layer 107, a drain electrode 1092, and a source electrode 1112 are included in a thin film transistor $Tr_2$ of the subpixel drive circuit 123. The thin film transistor $Tr_1$ is used as a selection transistor, and the thin film transistor $Tr_2$ is used as a drive transistor.

1.3.3. Organic EL Elements

The organic EL elements 130 each have a laminated structure in which the following layers are laminated on the multi-layered wiring laminate 120: a pixel electrode 132; a functional layer 133 including a hole injection layer, a hole transport layer, an organic light-emitting layer, and an electron transport layer; and a common electrode 134. The pixel electrodes 132 function as anodes of the organic EL elements 130, and the common electrode 134 functions as a cathode of the organic EL elements 130. The functional layers 133 have a function of emitting light through recombination of holes injected from the pixel electrodes 132 and electrons injected from the common electrode 134.

The pixel electrodes 132 are the first electrodes in the present disclosure, are arranged in a line or in a matrix on the planarization layer 118 of the multi-layered wiring laminate 120, and are electrically connected to the connection electrodes 116 of the multi-layered wiring laminate 120 through the contact holes 118a. Transparent conductive layers may further be laminated.

The pixel electrodes 132 are each a metal layer made of a material having small sheet resistance and high light reflectivity. For example, a metal material including silver (Ag) or aluminum (Al) can be used for the pixel electrodes 132. Alternatively to a layer of a metal such as aluminum, an alloy layer of a silver, palladium, and copper alloy (APC), a silver, rubidium, gold alloy (ARA), a molybdenum chromium alloy (MoCr), a nickel chromium alloy (NiCr), or the like can be used. The transparent conductive layers can be made by using indium tin oxide (ITO), indium zinc oxide (IZO), or the like. Further, in view of cost efficiency, a metal layer including aluminum as a main component or an alloy layer including aluminum as a main component is preferably used. The pixel electrodes 132 preferably have a thickness from 200 nm to 400 nm. In cases where the transparent conductive layers are laminated, the transparent conductive layers each preferably have a thickness of several nm.

Surfaces of the planarization layer 118, the branch lines 162 of the second power supply line 160, and the pixel electrodes 132 are covered by a hole injection layer 1331. The hole injection layer 1331 is made of an oxide of a transition metal element such as an oxide of a metal including a transition metal element or an oxide of an alloy including a transition metal element. Such a material is preferable as a metal or an alloy for a hole injection layer for a display panel.

Insulating layers 135 are over surface portions of the planarization layer 118 that are present in gaps between the pixel electrodes 132 adjacent to each other in the horizontal direction. The insulating layers 135 are made of an electrically-insulating material such as polyimide resin, acrylic resin, or the like.

Banks 122 are over the surface portions of the planarization layer 118 that are present in gaps between the pixel electrodes 132 adjacent to each other in the vertical direction. The banks 122 are made of, for example, an organic material such as acrylic resin, polyimide resin, novolac-type phenolic resin, or the like, or an inorganic material such as silicon oxide (SiO), silicon nitride (SiN), or the like, and define the subpixels. A height from an upper surface of the planarization layer 118 to upper surfaces of the banks 122 is approximately 1 μm, and the regions defined by the banks 122 are subpixel regions. Pixel regions are each composed of three subpixel regions arrayed in the horizontal line direction.

In each of the subpixel regions defined by the banks 122 and the insulating layers 135, a hole transport layer 1332 and an organic light-emitting layer 1333 are laminated in this order.

The hole transport layers 1332 are made of, for example, an electrically conductive polymer material such as poly(3, 4-ethylenedioxythiophene) polystyrene sulfonate (PEDOT-PSS) or a derivative (such as a copolymer) of PEDOT-PSS, and have a function of transporting holes injected from the hole injection layers 1331 to the organic light-emitting layers 1333.

The organic light-emitting layers 1333 are made of, for example, poly(9,9-di-n-octylfluorene-alt-benzothiadiazole) (F8BT), which is an organic polymer, and has a function of emitting light with use of electroluminescence. The organic light-emitting layers 1333 are not limited to a structure made of F8BT, and can have a structure including a known organic material. For example, as described in JPH5-163488, the organic light-emitting layers 1333 are preferably made of a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth metal complex.

An electron transport layer 1334, the common electrode 134, and the inorganic insulating layer 140 are laminated in this order and are each continuous over the regions defined by the banks 122.

The electron transport layer 1334 is made of, for example, barium, phthalocyanine, or lithium fluoride, or a mixture including at least one of these materials, and has a function of transporting electrons injected from the common electrode 134 to the organic light-emitting layers 1333.

The common electrode 134 is the second electrode in the present disclosure, and is made of, for example, indium tin oxide (ITO), indium zinc oxide (IZO), or the like. When the display panel 100 includes top-emission type organic EL elements, the common electrode 134 is preferably made of a light-transmissive material. When the common electrode 134 is made by using silver (Ag) or an alloy including silver, the common electrode 134 is thin enough to transmit light. Specifically, the common electrode 134 preferably has a thickness from 10 nm to 20 nm.

The organic EL elements 130 may be configured to include at least one of a hole injection layer, a hole transport layer, an electron injection layer, and an electron transport layer according to requirements. Further, the pixel electrodes 132, the organic light-emitting layers 1333, and the common electrode 134 may each have a single-layered structure or a multi-layered structure. In the present embodiment, the common electrode 134 is continuous over the organic EL elements 130 to form a single common electrode. The insulating layers 135 and the banks 122 have a function of electrically insulating the organic light-emitting layers 1333 of the organic EL elements 130.

1.3.4. Inorganic Insulating Layer

The inorganic insulating layer 140 has a function of suppressing exposure of organic layers such as the functional layers 133 to moisture, air, or the like, and is made by using, for example, a light-transmissive material such as silicon nitride (SiN), silicon oxynitride (SiON), or the like. Further, a sealing resin layer made of a resin material such as acrylic resin, silicone resin, or the like may be disposed on the layer made by using a material such as silicon nitride (SiN), silicon oxynitride (SiON), or the like. When the organic EL elements 130 are of a top-emission type, the inorganic insulating layer 140 is made of a light-transmissive material. The inorganic insulating layer 140 preferably has a thickness from 1 μm to 10 μm, and more preferably has a thickness from 5 μm to 6 μm. In the present embodiment, the inorganic insulating layer 140 is made by using silicon nitride (SiN) and has a thickness of approximately 5.5 μm.

1.4. Structure of Peripheral Region

Figure 4:
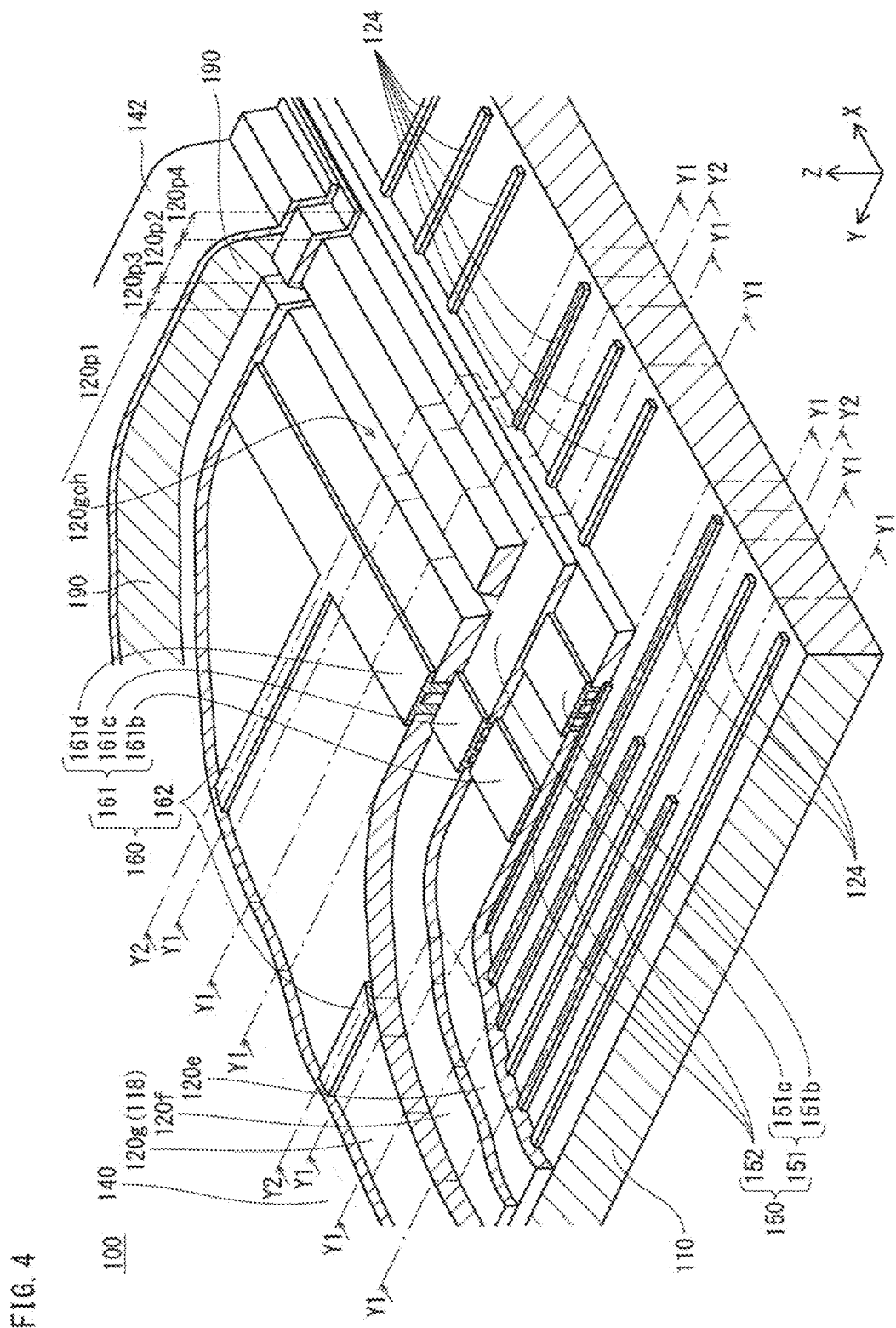
FIG. 4 is a partially cut-away perspective view of a peripheral region of the display panel 100 pertaining to at least one embodiment.
Figure 5:
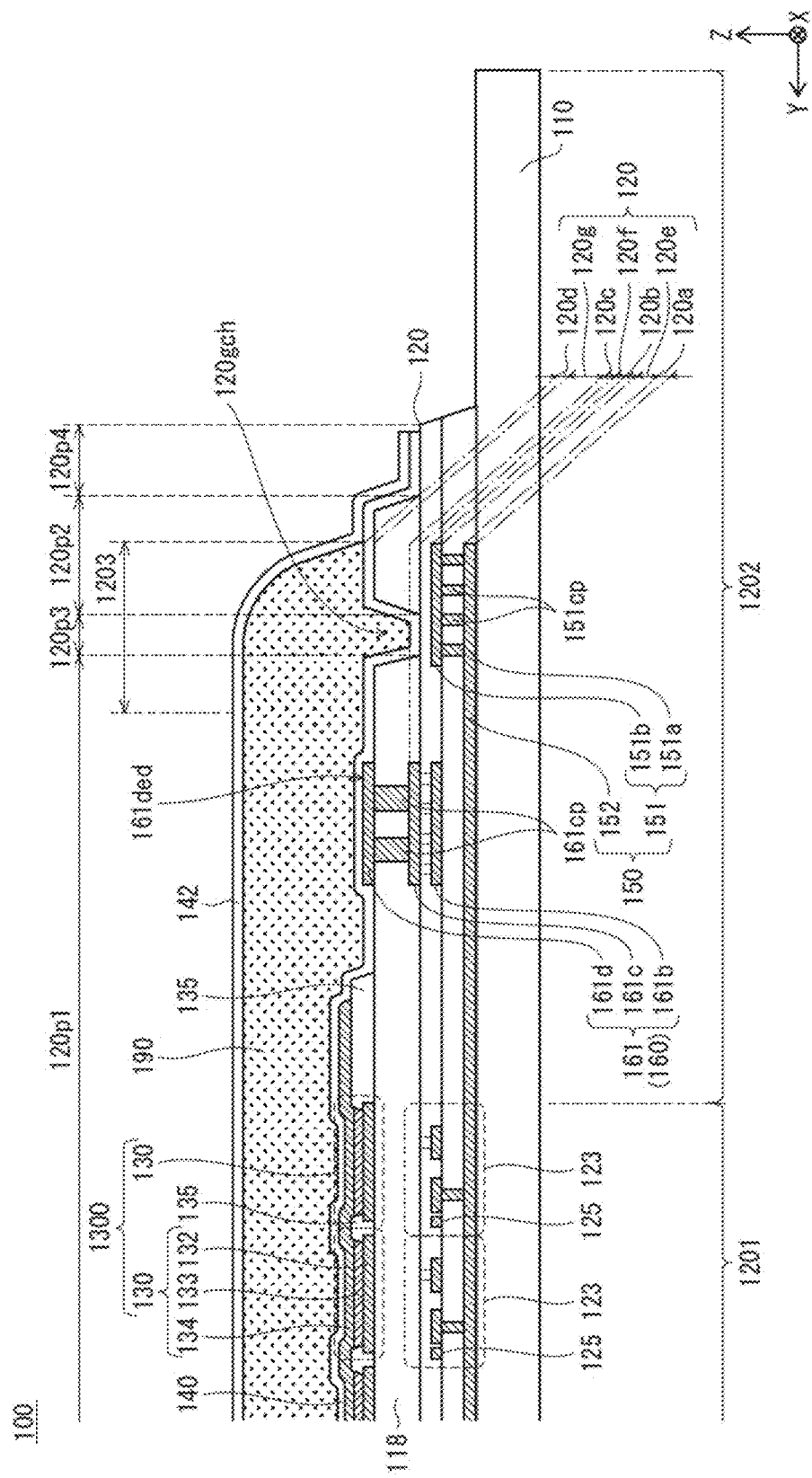
FIG. 5 is a partial cross-sectional view of the peripheral region of the display panel 100 pertaining to at least one embodiment, taken along line Y1-Y1 in FIG. 3 and FIG. 4.
Figure 6:
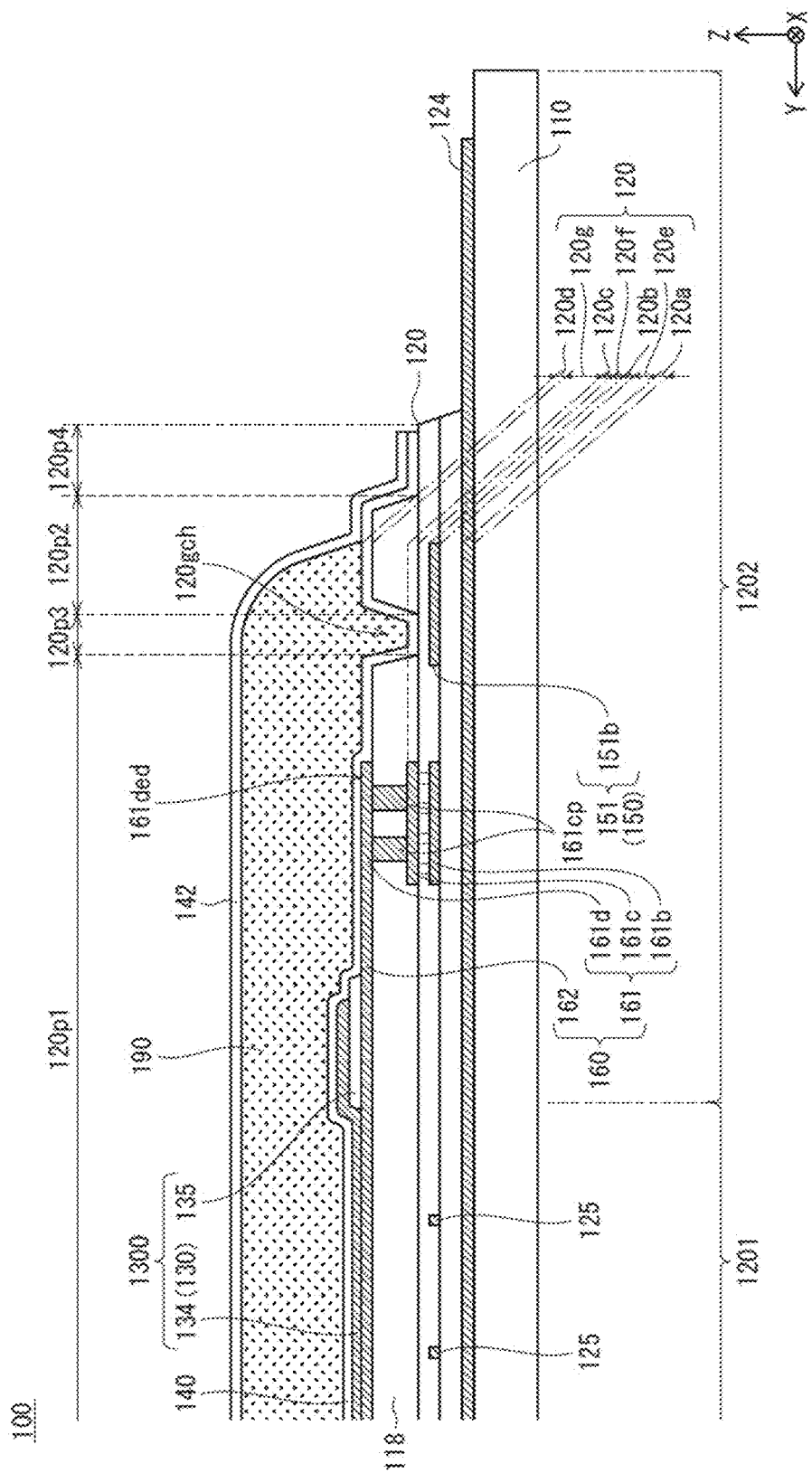
FIG. 6 is a partial cross-sectional view of the peripheral region of the display panel 100 pertaining to at least one embodiment, taken along line Y2-Y2 in FIG. 3 and FIG. 4.

The following describes a structure of the peripheral region of the display panel 100. FIG. 4 is a partially cut-away perspective view of the peripheral region of the display panel 100 pertaining to at least one embodiment. FIG. 4 shows a portion of the peripheral region 20 illustrated in FIG. 1A. FIG. 5 is a partial cross-sectional view of the peripheral region of the display panel 100 pertaining to at least one embodiment, taken along line Y1-Y1 in FIG. 3 and FIG. 4. FIG. 6 is a partial cross-sectional view of the peripheral region of the display panel 100 pertaining to at least one embodiment, taken along line Y2-Y2 in FIG. 3 and FIG. 4.

In FIG. 4, the display panel 100 includes the substrate 110, the multi-layered wiring laminate 120, an organic EL element array 1300, the inorganic insulating layer 140, an inorganic insulating layer 142, and a resin sealing layer 190.

1.4.1. Substrate

As described above, the substrate 110 is made of, for example, glass or resin.

1.4.2. Multi-Layered Wiring Laminate 120

(1) Overview of Multi-Layered Wiring Laminate 120

The multi-layered wiring laminate 120 is disposed on the substrate 110. The multi-layered wiring laminate 120 includes wiring layers 120a through 120d and interlayer insulating layers 120e through 120g. The wiring layers 120a through 120d are each made of a metal material. The interlayer insulating layers 120e through 120g are each made of an inorganic material or an organic material.

Correspondence between (i) the wiring layers 120a through 120d and the interlayer insulating layers 120e through 120g and (ii) the components of the thin film transistors Tr$_1$ and Tr$_2$, which compose a subpixel drive circuit 123 in FIG. 3, are as described below. The gate electrodes 102 and 103, the data signal lines 124, the branch lines 152 of the first power supply line 150 are in the wiring layer 120a. The gate insulating layer 105 and the channel inorganic insulating layer 108 are in the interlayer insulating layer 120e. The drain electrodes 1091 and 1092, the source electrodes 1111 and 1112, and the scan signal lines 125 are in the wiring layer 120b. The lower passivation layer 115 corresponds to the interlayer insulating layer 120f. As described above, the interlayer insulating layer 120f is made of an inorganic material. The branch lines 162 of the second power supply line 160 are in the wiring layer 120d. The planarization layer 118 corresponds to the interlayer insulating layer 120g. As described above, the interlayer insulating layer 120g is made of a resin material. The connection electrodes 116 are in the wiring layer 120c.

The wiring layers 120a through 120d may each have a single-layered structure or a multi-layered structure. Similarly, the interlayer insulating layers 120e through 120g may each have a single-layered structure or a multi-layered structure. The multi-layered wiring laminate 120 has different wiring structures in a display region portion 1201 corresponding to the display region 10 of the display panel 100 and in a peripheral region portion 1202 corresponding to the peripheral region 20 of the display panel 100. The display region portion 1201 of the multi-layered wiring laminate 120 includes the branch lines 152 of the first power supply line 150, the subpixel drive circuits 123, and the branch lines 162 of the second power supply line 160 (see FIG. 5). The peripheral region portion 1202 of the multi-layered wiring laminate 120 includes the trunk line 151 of the first power supply line 150 and the trunk line 161 of the second power supply line 160.

(2) Structure of Wiring Laminate

The following describes a wiring structure in the multi-layered wiring laminate 120.

In FIG. 5 and FIG. 6, the data signal lines 124 are in the wiring layer 120*a* and extend in the vertical direction (Y direction) from the subpixel drive circuits 123 in the display region portion 1201 to an outer periphery of the peripheral region portion 1202.

The scan signal lines 125 are in the wiring layer 120*b* and extend in the horizontal direction (X direction) from the subpixel drive circuits 123 in the display region portion 1201 to the outer periphery of the peripheral region portion 1202.

The branch lines 152 of the first power supply line 150 are in the wiring layer 120*a* and extend from the subpixel circuits 123 in the display region portion 1201 to the peripheral region portion 1202 to connect to the trunk line 151. The trunk line 151 of the first power supply line 150 includes a wire 151*a* in the wiring layer 120*a* and a wire 151*b* in the wiring layer 120*b*. In FIG. 5, the wire 151*a* and the wire 151*b* extend in the vertical direction (Y direction) and are connected to each other through contact plugs 151*cp*. The contact plugs 151*cp* have appropriate gaps in the horizontal direction between each other. That is, in the third part 120*p*3 of the multi-layered wiring laminate 120, which corresponds to the circumferential groove portion 120*gch*, and in the second part 120*p*2, which is outside the third part 120*p*3 in plan view, the first power supply line 150 extends to a layer (120*e*, 1200 lower than the highest layer (120*g*) by one or more layers through contact plugs 151*cp* in contact holes. Because the trunk line 151 includes two wires 151*a* and 151*b* as described above, the trunk line 151 has a large substantial cross-section and thus voltage decline in the trunk line 151 can be suppressed.

The branch lines 162 of the second power supply line 160 are in the wiring layer 120*d*, are connected to the common electrode 134 in the display region portion 1201, and extend to the peripheral region portion 1202 to connect to the trunk line 161. The trunk line 161 of the second power supply line 160 includes a wire 161*b* in the wiring layer 120*b*, a wire 161*c* in the wiring layer 120*c*, and a wire 161*d* in the wiring layer 120*d*. In FIG. 3, the wire 161*b*, the wire 161*c*, and the wire 161*d* extend in the vertical direction (Y direction) and are connected to each other through contact plugs 161*cp*. The contact plugs 161*cp* have appropriate gaps in the horizontal direction between each other. Because the trunk line 161 includes three wires 161*b*, 161*c*, and 161*d* as described above, the trunk line 161 has a large substantial cross-section, and thus voltage decline in the trunk line 161 can be suppressed. Further, the wire 161*d* of the trunk line 161 has a greater width than the wire 161*b* and the wire 161*c*. This further helps the trunk line 161 to have a large cross-section.

(3) Circumferential Groove Portion 120*gch* of Interlayer Insulating Layer 120*g* (Planarization Layer 118)

The following describes a structure of the interlayer insulating layer 120*g*.

In FIG. 4, FIG. 5, and FIG. 6, the multi-layered wiring laminate 120 has a circumferential groove portion 120*gch* having a groove structure formed by removing the interlayer insulating layer 120*g* in the peripheral region portion 1202, which surrounds the display region portion 1201 in which the organic EL element array 1300 is arranged. Specifically, the multi-layered wiring laminate 120 has a first part 120*p*1, a second part 120*p*2, a third part 120*p*3, and a fourth part 120*p*4. The first part 120*p*1 corresponds to a portion of the resin interlayer insulating layer 120*g*, which is the highest layer among the interlayer insulating layers 120*e*, 120*f*, and 120*g*, and the organic EL element array 1300 is arranged on the first part 120*p*1. The second part 120*p*2 surrounds the first part 120*p*1 in plan view, and a bank-shaped portion of the interlayer insulating layer 120*g* is present in the second part 120*p*2. The third part 120*p*3 is between an outer circumference of the first part 120*p*1 and an inner circumference of the second part 120*p*2 in plan view and corresponds to the circumferential groove portion 120*gch* having a shape of a circumferential groove in which the interlayer insulating layer 120*g* is not present. The fourth part 120*p*4 surrounds the second part 120*p*2, and the resin insulating layer 120*g* is not present in the fourth part 120*p*4. The gap in the circumferential groove portion 120*gch*, from which the interlayer insulating layer 120*g* is removed, is preferably from 300 µm to 800 µm, and more preferably is from 400 µm to 600 µm. In the present embodiment, the gap in the circumferential groove portion 120*gch* is approximately 500 µm.

Further, the second power supply line 160 is present neither in the third part 120*p*3 of the multi-layered wiring laminate 120, which corresponds to the circumferential groove portion 120*gch*, nor in the second part 120*p*2, which is outside the third part 120*p*3 in plan view. An outer end 161*ded* of the trunk line 161 of the second power supply line 160 is spaced away from the portion of the interlayer insulating layer 120*g* that is present in the second part 120*p*2 of the multi-layered wiring laminate 120.

1.4.3. Organic EL Element Array 1300

The organic EL element array 1300 is disposed on the multi-layered wiring laminate 120. The organic EL element array 1300 includes a plurality of organic EL elements 130, and the insulating layers 135 and the banks 122 disposed between the organic EL elements 130. As described above, the organic EL elements 130 each have a multi-layered structure including a laminate of thin films of various materials, and each include a pixel electrode 132, a functional layer 133 disposed on the pixel electrode 132, and a common electrode 134 disposed on the functional layer 133.

1.4.4. Inorganic Insulating Layer 140

As described above, the inorganic insulating layer 140 covers the organic EL element array 1300 and the multi-layered wiring laminate 120. The inorganic insulating layer 140 has a single-layered structure or a multi-layered structure. The inorganic insulating layer 140 is made by using, for example, a light-transmissive material such as silicon nitride (SiN), silicon oxynitride (SiON), or the like, and has a function of suppressing exposure of organic layers such as the functional layers 133 to moisture, air, and the like.

The inorganic insulating layer 140 extends at least to the second part 120*p*2 of the multi-layered wiring laminate 120 in plan view. In the third part 120*p*3, the inorganic insulating layer 140 is in contact with the interlayer insulating layer 120*f* through a bottom surface of the circumferential groove portion 120*gch* of the interlayer insulating layer 120*g*. Further, the inorganic insulating layer 140 may extend outside the third part 120*p*3 of the multi-layered wiring laminate 120 in plan view and cover the inorganic interlayer insulating layers 120*e* and 120*f* and the substrate 110. This structure helps to improve sealing property of the inorganic insulating layer 140 and prevent moisture penetration from outside the substrate in plan view into the interlayer insulating layer 120*g*.

Further, in the display region portion 1201, the inorganic insulating layer 140 covers the organic EL element array 1300, the power supply line 160, and the interlayer insulating layer 120*g*. Even when moisture penetrates into the resin sealing layer 190, this structure helps to prevent moisture from penetrating from the resin sealing layer 190 into the interlayer insulating layer 120*g*.

1.4.5. Resin Sealing Layer 190

The resin sealing layer 190 covers the substrate 110 and the organic EL element array 1300. Because the display panel 100 is a top-emission type of panel, the resin sealing layer 190 is made by using light-transmissive resin. For a material of the resin sealing layer 190, for example, acrylic resin, styrenic resin, polycarbonate resin, epoxy resin, silicone resin, or vinyl resin may be used. In the present embodiment, as illustrated in FIG. 6, the sealing material 190X is applied such that, in plan view, an outer periphery of the sealing material 190X is in the second part 120*p*2 of the multi-layered wiring laminate 120, in which a portion of the interlayer insulating layer 120*g* is present. Here, the portion of the interlayer insulating layer 120*g* in the second part 120*p*2 preferably has a width greater than a size of a drop of the sealing material 190X when being applied by inkjets, i.e. approximately 100 μm or greater. Thus, the width of the portion of the interlayer insulating layer 120*g* in the second part 120*p*2 preferably is, for example, from 300 μm to 700 μm at its apex portion, taking into account application positions and application amount unevenness. In the present embodiment, the width of the portion of the interlayer insulating layer 120*g* in the second part 120*p*2 is approximately 550 μm. Further, the resin sealing layer 190 preferably has a thickness from 5 μm to 15 μm. In the present embodiment, the resin sealing layer 190 is made by using ultraviolet-curing resin and has a thickness of approximately 10 μm.

1.4.6. Inorganic Insulating Layer 142

The inorganic insulating layer 142 is made of the same material as the inorganic insulating layer 140 and covers the resin sealing layer 190. In the peripheral region portion 1202, the inorganic insulating layer 142 extends outside an outer periphery of the resin sealing layer 190, which is made of a resin material, in plan view and is in close contact with the inorganic insulating layer 140, which is made of an inorganic material. This structure helps to improve sealing property of the inorganic insulating layer 142 and prevent moisture penetration from outside the substrate in plan view into the interlayer insulating layer 190. The inorganic insulating layer 142 preferably has a thickness from 1 μm to 10 μm, and more preferably has a thickness from 5 μm to 6 μm. In the present embodiment, the inorganic insulating layer 142 is made by using silicon nitride (SiN) and has a thickness of approximately 5.5 μm.

1.4.7. Functions of Components in Peripheral Region of Display Panel 100

Figure 7:
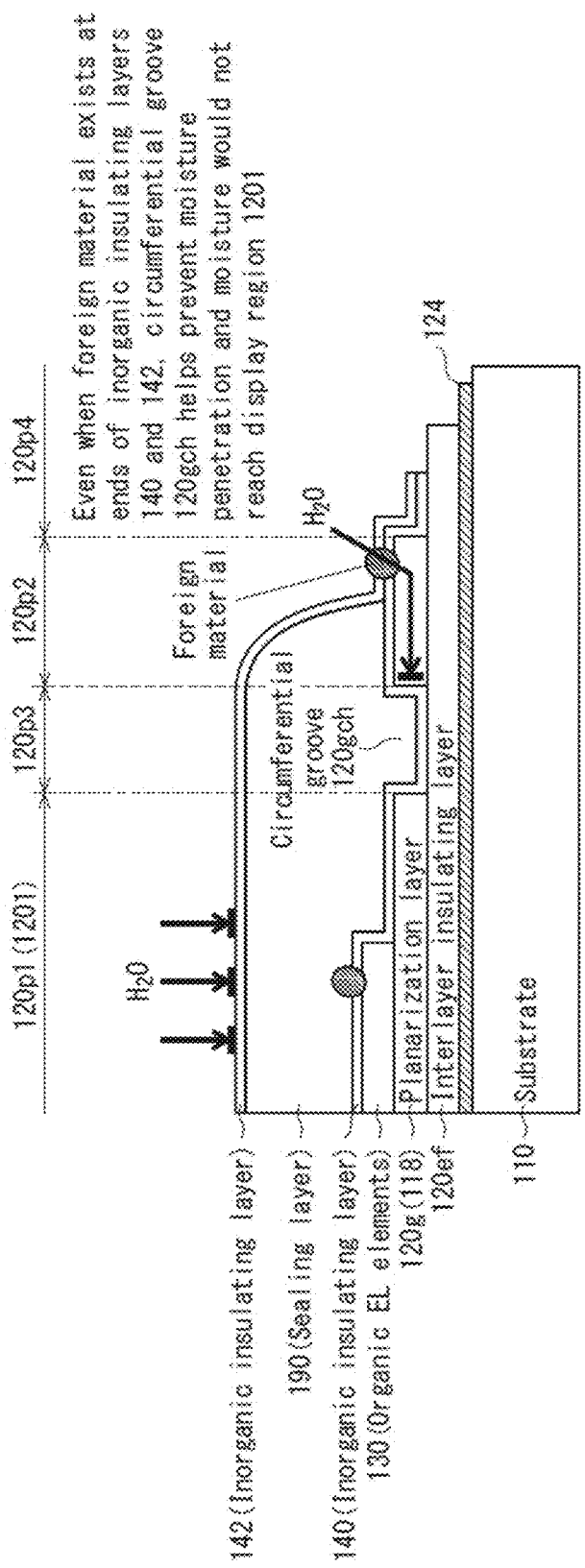
FIG. 7 is a schematic cross-sectional view of the peripheral region of the display panel 100 pertaining to at least one embodiment.

The following describes functions of components of the display panel 100 in the peripheral region (the interlayer insulating layer 120*g*, the inorganic insulating layers 140 and 142, and the resin sealing layer 190). FIG. 7 is a schematic cross-sectional view of the peripheral region of the display panel 100 pertaining to at least one embodiment.

(1) Prevention of Flowing-Out of Sealing Material 190X after Application

Figure 8:
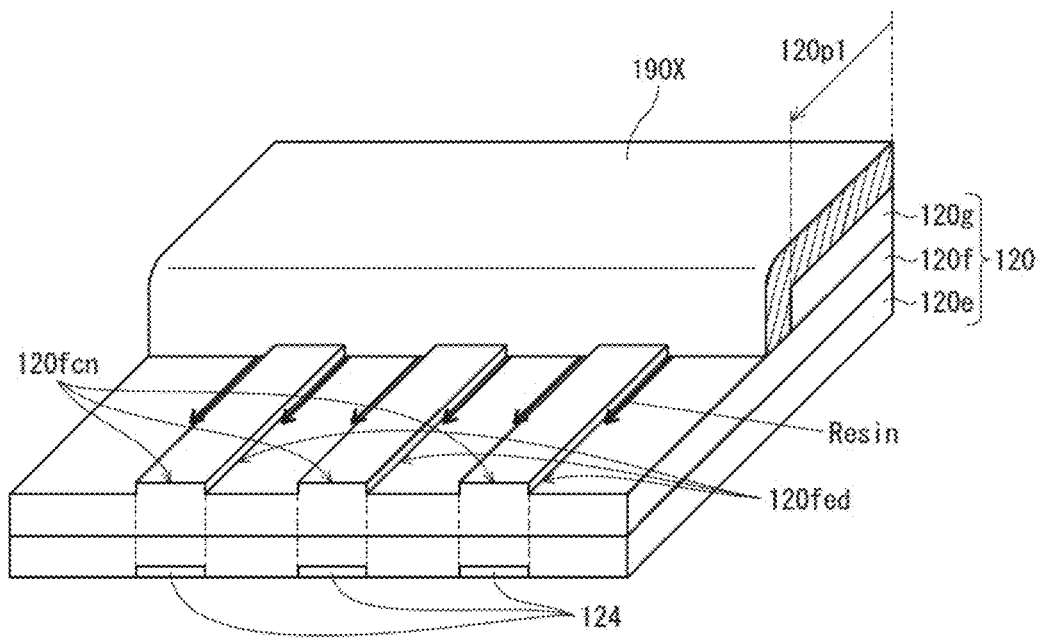
FIG. 8 is a schematic view of a resin sealing layer material on an upper surface of an interlayer insulating layer 120f of a multi-layered wiring laminate 120 pertaining to at least one embodiment.
Figure 13:
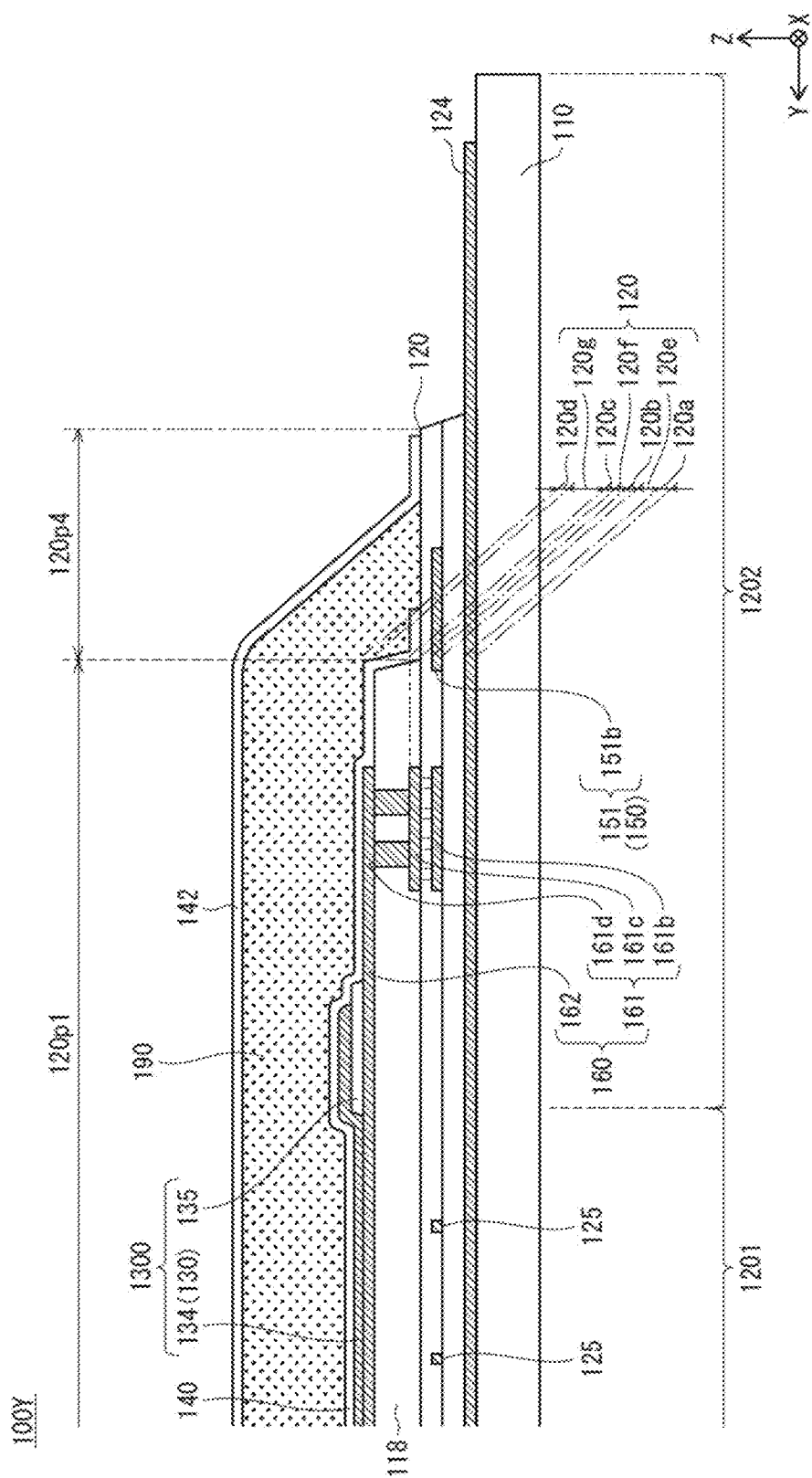
FIG. 13 is a partial cross-sectional view of a peripheral region of a display panel 100Y pertaining to a comparative example, showing a cross-section corresponding to the cross-section taken along line Y2-Y2 in FIG. 3 and FIG. 4.

The sealing material 190X is a material of the resin sealing layer 190 in an uncured state. When manufacturing the display panel 100, the sealing material 190X is applied by dispensing, screen printing, or inkjets, and is cured by performing a process for curing the sealing material 190X. For example, the sealing material 190X is heated when the sealing material 190X has a thermosetting property; alternatively, the sealing material 190X is irradiated by using ultraviolet rays when the sealing material 190X has an ultraviolet-curing property. The material of the resin sealing layer 190 in an uncured state is a liquid having relatively low viscosity; for example, the material of the resin sealing layer 190 in an uncured state has viscosity of approximately 10 mPa·s. Accordingly, as shown in FIG. 13 described later, a conventional structure in which the sealing material 190X is applied on the interlayer insulating layer 120*f* of the multi-layered wiring laminate 120 has a problem of flowing-out phenomenon of the sealing material 190X. FIG. 8 is a schematic view of a resin sealing layer material on an upper surface of the interlayer insulating layer 120*f* of the multi-layered wiring laminate 120 pertaining to at least one embodiment. In FIG. 8, convex portions 120*fcn* are observed on the surface of the interlayer insulating layer 120*f* due to patterns of the wiring layers 120*a*, 120*b*, and 120*c* of the multi-layered wiring laminate 120. When the sealing material 190X is applied on the surface of such an interlayer insulating layer 120*f*, there is a problem caused by capillary effect such that the sealing material 190X, which has low viscosity, may be attracted by corner portions 120*fed* at the bottom portions of the convex portions 120*fcn* and flow out along the patterns of the convex portions 120*fcn* before the curing process is performed. In such cases, the outer periphery of the sealing material 190X after application may move in an outer peripheral direction of the multi-layered wiring laminate 120, and the sealing material 190X that is present in a vicinity of an outer periphery of the inorganic insulating layer 142 may hinder forming of the inorganic insulating layer 142. In such cases, the sealing material 190X, which includes an organic material, passes from inside to outside of the inorganic insulating layer 142. This impairs sealing, such that a sufficient sealing property cannot be obtained.

In contrast, in the display panel 100, as illustrated in FIG. 6 and FIG. 7, the sealing material 190X is applied such that, in plan view, the outer periphery of the sealing material 190X is in the second part 120*p*2 of the multi-layered wiring laminate 120, in which a portion of the interlayer insulating layer 120*g* is present. The interlayer insulating layer 120*g* is the planarization layer 118, and thus convex portions appearing due to the patterns of the wiring layers 120*a*, 120*b*, and 120*c* have a low height. Accordingly, when the sealing material 190X is applied on the interlayer insulating layer 120*g*, the sealing material 190X can be prevented from being attracted, due to the capillary effect, by the corner portions 120*fed* at the bottom portions of the convex portions 120*fcn* of the multi-layered wiring laminate 120. This helps to prevent the sealing material 190X from flowing out along the patterns of the convex portions 120*fcn* before the curing process is performed. Due to this, the outer periphery of the sealing material 190X immediately after application is maintained when the sealing material 190X is cured. As a result, the inorganic insulating layer 142 can be appropriately formed and sealing property can be maintained. That is, in the display panel 100, the sealing material 190X can be prevented from flowing out immediately after application irrespective of the patterns of the wiring layers 120a, 120b, and 120c, and sealing property of the inorganic insulating layer 142 can be maintained.

(2) Functions of Structure in which Inorganic Insulating Layer 140 and Inorganic Insulating Layer 142 Enclose Resin Sealing Layer 190 and Seal Interlayer Insulating Layer 120g By sandwiching the resin sealing layer 190 between the inorganic insulating layer 140 and the inorganic insulating layer 142 and joining the inorganic insulating layer 140 and the inorganic insulating layer 142 around the resin sealing layer 190, the resin sealing layer 190 can be enclosed in a packet-shaped structure formed by the inorganic insulating layer 140 and the inorganic insulating layer 142, which are inorganic layers. This structure helps to prevent moisture from penetrating into the resin sealing layer 190, which is an organic layer.

Further, even when the inorganic insulating layer 140 or the inorganic insulating layer 142 having a film flaw is formed during forming of the display panel 100 due to a foreign material in a lower layer, the double-layered structure in which the inorganic insulating layer 140 and the inorganic insulating layer 142 are laminated helps to prevent moisture penetration from outside. Due to including a laminate of the inorganic insulating layer 140 and the inorganic insulating layer 142, which are not formed at the same time, even when one of these two layers has a film flaw, the other of the two layers helps to maintain sealing property.

Further, in the display panel 100, the inorganic insulating layer 140 and the inorganic insulating layer 142 are joined to each other on the second part 120p2 of the multi-layered wiring laminate 120, which is outside the circumferential groove portion 120gch in the third part 120p3 of the multi-layered wiring laminate 120 in plan view. Even when the inorganic insulating layer 140 has a film flaw and the film flaw in a lower layer causes a film flaw to appear in the inorganic insulating layer 142 at the same position in plan view as the film flaw in the lower layer in forming of the inorganic insulating layer 142, moisture may penetrate into the portion of the interlayer insulating layer 120g in the second part 120p2 due to the film flaws. However, moisture would not penetrate into the display region 1201 because the circumferential groove portion 120gch, which is inside the second portion 120p2 in plan view, prevents moisture from penetrating into a region inside the circumferential groove portion 120gch in plan view. That is, sealing property of the display panel 100 can further be improved because the display panel 100 has no portion within the circumferential groove portion 120gch in which the inorganic insulating layer 140 and the inorganic insulating layer 142 are in direct contact with each other.

(3) Function of Circumferential Groove Portion 120gch of Interlayer Insulating Layer 120g The inorganic insulating layer 140 extends at least to the second part 120p2 of the multi-layered wiring laminate 120 in plan view, and in the third part 120p3, the inorganic insulating layer 140 is in contact with the interlayer insulating layer 120f in the bottom surface of the circumferential groove portion 120gch of the interlayer insulating layer 120g in which a second power supply line 160 is absent.

As described above, the interlayer insulating layer 120g is made of an electrically-insulating material such as polyimide resin, acrylic resin, or the like, and absorbs moisture easily. However, the circumferential groove portion 120gch helps to prevent moisture penetration into the display region portion 1201 even when moisture penetrates from the substrate outer peripheral direction into the portion of the interlayer insulating layer 120g outside the circumferential groove portion 120gch in plan view (second part 120p2). That is, in plan view, because the portion of the interlayer insulating layer 120g inside the circumferential groove portion 120gch (first part 120p1) is spaced away from the portion of the interlayer insulating layer 120g outside the circumferential groove portion 120gch (second part 120p2) through the circumferential groove portion 120gch, moisture in the portion of the interlayer insulating layer 120g outside the circumferential groove portion 120gch (second part 120p2) can be prevented from penetrating through the portion of the interlayer insulating layer 120g inside the circumferential groove portion 120gch (first part 120p1) into the display region portion 1201.

Further, the inorganic insulating layer 140 may extend outside the second part 120p2 of the multi-layered wiring laminate 120 in plan view and cover the interlayer insulating layers 120e and 120f and the substrate 110.

Due to this, the interlayer insulating layer 120g, which is made of resin and absorbs moisture easily, is covered by the inorganic insulating layer 140, which is made of an inorganic material that does not absorb moisture, up to the outer periphery. This structure helps to prevent moisture penetration from, for example, the substrate outer peripheral direction into the portion of the interlayer insulating layer 120g outside the circumferential groove portion 120gch in plan view (second part 120p2).

2. Manufacturing Method of Display Panel

The following describes a method of manufacturing the display panel 100. FIG. 9A, FIG. 9B, FIG. 9C, FIG. 10A, FIG. 10B, FIG. 10C, FIG. 11A, FIG. 11B, FIG. 12A, and FIG. 12B are cross-sectional views of processes of manufacturing the display panel 100 pertaining to at least one embodiment, taken along line Y1-Y1 in FIG. 3 and FIG. 4.

First, the substrate 110, which is made of a flexible resin film, is temporarily bonded onto a glass base 110g (FIG. 9A). Then, the multi-layered wiring laminate 120 is formed by sequentially forming the wiring layers 120a through 120c and the interlayer insulating layers 120e through 120f on the substrate 110 (FIG. 9B). The wiring layers 120a through 120c and the interlayer insulating layers 120e through 120f can be manufactured by known TFT manufacturing methods. In the present embodiment, the pixel electrodes 132 of the organic EL elements 130 are formed in the same process as forming of the wires 161 and 162 of the second power supply line 160.

Then, the interlayer insulating layer 120g (planarization layer 118) is formed by applying a component material (photosensitive resin material) of the interlayer insulating layer 120g described above as a photoresist on surfaces of the interlayer insulating layer 120f and the wiring layer 120c to achieve surface planarization (FIG. 9C).

The contact holes 118a and 118b and the circumferential groove portion 120gch are formed by the following processes. After the interlayer insulating layer 120g is formed, a photomask having predefined apertures is placed on the interlayer insulating layer 120g, and the pattern of the photomask is transferred to the interlayer insulating layer 120g by exposing the interlayer insulating layer 120g from above to ultraviolet rays. Then, the interlayer insulating layer 120g in which the contact holes 118a and 118b and the circumferential groove portion 120gch are patterned is formed by developing (FIG. 10A). The wiring layer 120c on the interlayer insulating layer 120f is exposed at the bottom of the contact holes.

Next, the multi-layered wiring laminate 120 including the third part 120p3, the first part 120p1, and the second part 120p2 is formed. In plan view, the third part 120p3 corresponds to the circumferential groove portion 120gch, from which the resin interlayer insulating layer 120g, which is the highest layer among the interlayer insulating layers 120e, 120f, and 120g, is removed; the first part 120p1 is inside the circumferential groove portion 120gch, and a portion of the interlayer insulating layer 120g is present in the first part 120p1; and the second part 120p2 is outside the circumferential groove portion 120gch, and a portion of the interlayer insulating layer 120g is present in the second part 120p2.

Then, a surface of the interlayer insulating layer 120g is cleaned by dry-etching before film-forming. Then, a metal layer for forming the trunk line 161d and the branch lines (not illustrated) of the second power supply line 160 and the pixel electrodes 132 is formed on the surface of the interlayer insulating layer 120g by a vapor phase growth process such as sputtering, vacuum vapor deposition, or the like. In the present embodiment, a film made of aluminum or an alloy whose main component is aluminum is formed by sputtering.

Then, a photoresist layer is formed by applying a photoresist made of photosensitive resin or the like. Then, a photomask having predefined apertures is placed on the photoresist layer, and the pattern of the photomask is transferred to the photoresist layer by exposing the photoresist layer from above to ultraviolet rays. Then, the photoresist layer is patterned by developing. Then, the metal layer is patterned by etching the metal layer through the patterned photoresist layer to form the pixel electrodes 132 and the trunk line 161 and the branch lines (not illustrated) of the second power supply line 160 (FIG. 10B). Here, the outer end 161ded of the trunk line 161 is spaced away from the portion of the interlayer insulating layer 120g in the second part 120p2 of the multi-layered wiring laminate 120.

Here, the branch lines 162 and the trunk line 161 of the second power supply line 160 are in the wiring layer 120d on the interlayer insulating layer 120g at least in the first part 120p1 of the multi-layered wiring laminate 120. Further, the outer end 161ded of the trunk line 161 is patterned to be located in the first part 120p1 of the multi-layered wiring laminate 120.

Then, the insulating layers 135 and the banks 122 (not illustrated) are formed on the multi-layered wiring laminate 120, the functional layers 133 are formed on the pixel electrodes 132, and the common electrode 134 is formed on the functional layers 133 (FIG. 10C). By these processes, the organic EL element array 1300 is formed on the multi-layered wiring laminate 120.

Here, prior to forming of the insulating layers 135 and the banks 122, a metal layer for forming the hole injection layers 1331 (not illustrated) may be formed on surfaces of the pixel electrodes 132, the second power supply line 160, and the interlayer insulating layer 120g by a vapor phase growth process. In such cases, a layer of tungsten is preferably formed by sputtering.

Then, the organic insulating layer 140, which covers the organic EL element array 1300 and the multi-layered wiring laminate 120, is formed to extend at least to the second part 120p2 of the multi-layered wiring laminate 120 in plan view by, for example, chemical vapor deposition (CVD) or sputtering (FIG. 11A). Here, the inorganic insulating layer 140 is in contact with the interlayer insulating layer 120f at the bottom surface of the circumferential groove portion 120gch of the interlayer insulating layer 120g. By these processes, a panel intermediate product 100X including the substrate 110, the multi-layered wiring laminate 120, the organic EL element array 1300, and the inorganic insulating layer 140 is obtained.

Then, the sealing material 190X is applied to cover the display region 1201 of the panel intermediate product 100X (FIG. 11B). Here, the sealing material 190X is applied such that, in plan view, the outer periphery of the sealing material 190X is in the second part 120p2 of the multi-layered wiring laminate 120, in which a portion of the interlayer insulating layer 120g is present. The sealing material 190X is a material in an uncured state for the resin sealing layer 190 and is a liquid having low viscosity. For example, the sealing material 190X has viscosity of approximately 10 mPa·s. The sealing material 190X may be applied by, for example, dispensing, screen printing, or inkjets. Then, a process for curing the sealing material 190X is performed. For example, the sealing material 190X is heated when the sealing material 190X has a thermosetting property; alternatively, the sealing material 190X is irradiated by using ultraviolet rays when the sealing material 190X has an ultraviolet-curing property. In the present embodiment, ultraviolet-curing resin is applied by inkjets and is cured by irradiating the ultraviolet-curing resin by using ultraviolet rays.

Figure 12A:
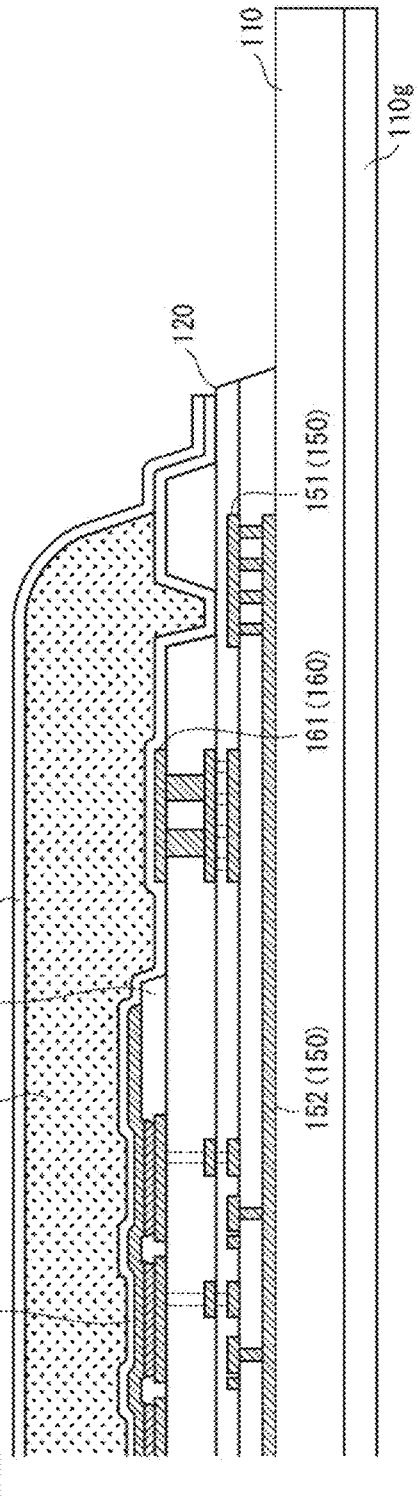
FIG. 12A and FIG. 12B are cross-sectional views of processes of manufacturing the display panel 100 pertaining to at least one embodiment, taken along line Y1-Y1 in FIG. 3 and FIG. 4.
Figure 12B:
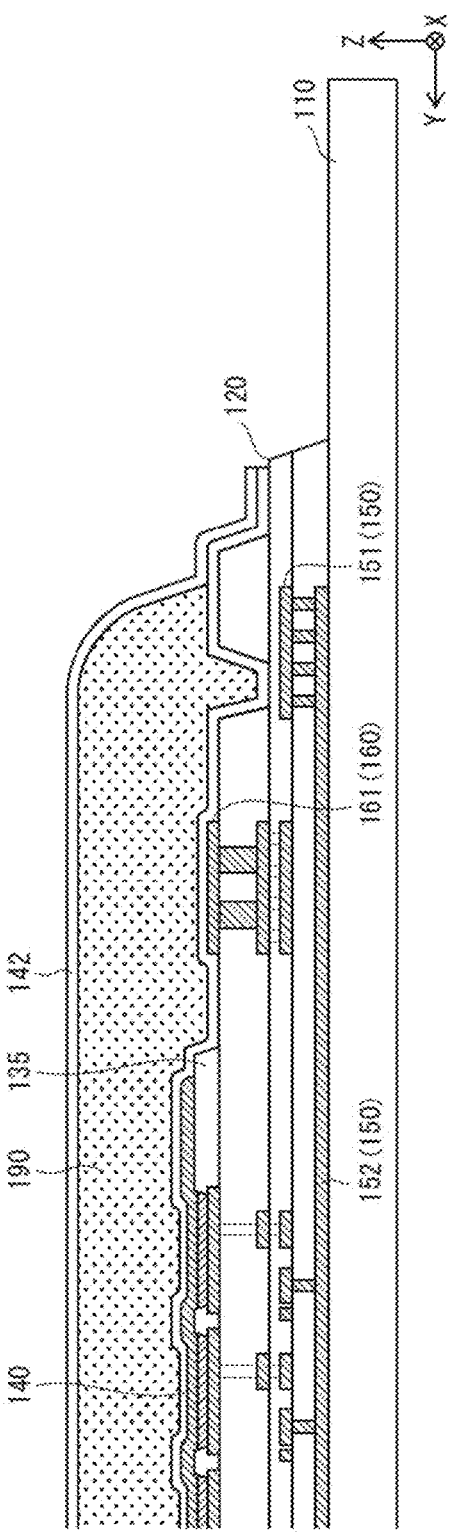

Then, the inorganic insulating layer 142 covering the resin sealing layer 190 and the inorganic insulating layer 140 on the panel intermediate product 100X is formed by, for example, CVD or sputtering such that the inorganic insulating layer 142 extends at least to the second part 120p2 of the multi-layered wiring laminate 120 in plan view (FIG. 12A). Here, the inorganic insulating layer 142 is in contact with the inorganic insulating layer 140 at least in the second part 120p2 of the multi-layered wiring laminate 120, which is outside the resin sealing layer 190 in plan view. Finally, the portion of the substrate 110 at which the substrate 110 is bonded to the glass base 110g is irradiated by using a laser beam, such that the substrate 110, which is made of a resin film, is peeled from the glass base 110g. This completes the display panel 100 (FIG. 12B).

3. Evaluation Examinations

Evaluation examinations were performed by using a comparative example and a working example of the display panel 100 pertaining to the present embodiment.

3.1. Samples to be Tested

Evaluation examinations were performed using the comparative example and the working example of the display panel 100. FIG. 13 is a partial cross-sectional view of a peripheral region of a display panel 100Y pertaining to the comparative example, showing a cross-section corresponding to the cross-section taken along line Y2-Y2 in FIG. 3 and FIG. 4.

In the working example, in FIG. 6, the sealing material 190X is applied such that, in plan view, the outer periphery of the sealing material 190X is in the second part 120p2 of the multi-layered wiring laminate 120, in which a portion of the interlayer insulating layer 120g is present. In contrast, in the comparative example, in FIG. 13, the multi-layered wiring laminate 120 does not include the second part 120p2 and the third part 120p3; the sealing material 190X is applied such that, in plan view, an outer periphery of the sealing material 190X is in a fourth part 120p4 of the multi-layered wiring laminate 120 in which no interlayer insulating layer 120g is present.

3.2. Examination Procedures 3.2.1. Sealing Material 190X Application Examination After the sealing material 190X was applied during manufacturing of the display panel, the extent to which resin in the sealing material 190X has flowed out was observed to evaluate shape stability of the sealing material 190X after application.

3.2.2. High-Temperature and High-Humidity Storage Examination

The two samples were placed under temperature of 60° C. and relative humidity of 90%, and moisture penetration into wiring was observed after 1000 hours.

3.3. Examination Results 3.3.1. Sealing Material 190X Application Examination

FIG. 14A is a photograph of the multi-layered wiring laminate 120 in the peripheral region of the working example of the display panel 100 pertaining to at least one embodiment, seen from the upper surface of the inorganic insulating layer 140 on the multi-layered wiring laminate. FIG. 14B is a photograph of the multi-layered wiring laminate 120 in the peripheral region of the display panel 100Y pertaining to the comparative example, seen from the upper surface of the inorganic insulating layer 140 on the multi-layered wiring laminate.

In the comparative example, in FIG. 14B, flowing-out of the sealing material 190X along the wires of the multi-layered wiring laminate 120 was observed. By the time ultraviolet irradiation was performed, such flowing-out of the sealing material 190X progressed from a region 190X immediately after application to a region 190X' in a vicinity of the outer periphery of the inorganic insulating layer 142.

In contrast, in the working example, in FIG. 14A, no flowing-out of the sealing material 190X along the wires of the multi-layered wiring laminate 120 was observed, and the region 190X immediately after application was approximately the same as the region 190X when ultraviolet irradiation was performed.

3.3.2. High-Temperature and High-Humidity Storage Examination

In the comparative example, it was observed that corrosion progressed to the trunk line 161, the branch lines 162, and the pixel electrodes 132 in the display region portion 1201 after 1000 hours.

In contrast, in the working example, no corrosion was observed in the trunk line 161, the branch lines 162, or the pixel electrodes 132 in the display region portion 1201 after 1000 hours.

4. Effects

As described above, the display panel 100 pertaining to the present disclosure includes a substrate 110. The organic EL display panel 100 further includes a multi-layered wiring laminate 120 disposed on the substrate 110 and including wiring layers 120a, 120b, 120c, and 120d and a plurality of insulating layers 120e, 120f, and 120g, the wiring layers 120a, 120b, 120c, and 120d disposed on at least one of the insulating layers 120e, 120f, and 120g and extending to a vicinity of an outer periphery of the multi-layered wiring laminate 120. The organic EL display panel 100 further includes an organic EL element array 1300 disposed on the multi-layered wiring laminate 120 and including organic EL elements 130 that are connected to data signal lines 124. The organic EL display panel 100 further includes a first inorganic insulating layer 140 disposed at least on the organic EL element array 1300 and extending outside the outer periphery of the multi-layered wiring laminate 120 in plan view. The organic EL display panel 100 further includes a resin sealing layer 190 disposed on the first inorganic insulating layer 140, the resin sealing layer 190 covering the organic EL element array 1300 in plan view and having an outer periphery above a resin insulating layer 120g that is a highest layer among the insulating layers 120e, 120f, and 120g in the multi-layered wiring laminate 120. The organic EL display panel 100 further includes a second inorganic insulating layer 142 disposed at least on the resin sealing layer 190, the second inorganic insulating layer 142 extending outside the outer periphery of the resin sealing layer 190 in plan view and being in contact with the first inorganic insulating layer 140 in a thickness direction.

This helps to achieve a structure in which a resin material for covering the organic EL light-emitting element array is prevented from flowing out immediately after application and thus helps to improve sealing property of the organic EL display panel.

Further, even when the inorganic insulating layer 140 or the inorganic insulating layer 142 having a film flaw is formed during forming of the display panel 100 due to a foreign material in a lower layer, the double-layered structure in which the inorganic insulating layer 140 and the inorganic insulating layer 142 are laminated helps to prevent moisture penetration from outside. Due to including the inorganic insulating layer 140 and the inorganic insulating layer 142, which are not formed at the same time, even when one of these two layers has a film flaw, the other of the two layers helps to maintain sealing property of the display panel 100.

According to at least one embodiment of the organic EL display panel 100, the second inorganic insulating layer 142 extends outside the outer periphery of the multi-layered wiring laminate 120 in plan view and is in contact with the first inorganic insulating layer 140 above the substrate 110.

This structure helps to prevent moisture from penetrating into the resin sealing layer 190 and the resin insulating layer 120g, which are organic layers.

Further, according to at least one embodiment of the organic EL display panel 100, the multi-layered wiring laminate 120 includes: a first part 120p1 on which the organic EL element array 1300 is disposed and in which a first portion of the resin insulating layer 120g is present; a second part 120p2 that surrounds the first part 120p1 in plan view and in which a second portion of the resin insulating layer 120g having a bank-shape is present; a third part 120p3 that is between the first part 120p1 and the second part 120p2 in plan view and that has a shape of a circumferential groove in which the resin insulating layer 120g is not present; and a fourth part 120p4 that surrounds the second part 120p2 and in which the resin insulating layer 120g is not present. The data signal lines 124 extend from the first part 120p1 to the fourth part 120p4 in plan view, the outer periphery of the resin sealing layer 190 being in the second part 120p2 in plan view, and the first inorganic insulating layer 140 and the second inorganic insulating layer 142 extending to the fourth part 120p4 in plan view and the first inorganic insulating layer 140 and the second inorganic insulating layer 142 being in contact with each other outside the outer periphery of the resin sealing layer 190.

According to this structure, in plan view, the circumferential groove portion 120gch, which is inside the second part 120p2, helps to prevent moisture from penetrating into a region inside the circumferential groove portion 120gch. Accordingly, moisture would not penetrate into the display region 1201. That is, sealing property of the display panel 100 can further be improved because the display panel 100 has no portion inside the circumferential groove portion 120gch in plan view in which the inorganic insulating layer 140 and the inorganic insulating layer 142 directly overlap with each other.

As described above, the organic EL display panel pertaining to at least one embodiment of the present disclosure helps to prevent a resin material covering the organic EL light-emitting element array from flowing out immediately after application, and thus helps to improve sealing property of the organic EL display panel.

5. Modifications

The display panel 100 according to at least one embodiment has been described, but the present invention is not limited to the embodiment above. For example, various modifications of embodiments conceived by a person having ordinary skill in the art, and any combination of elements and functions of embodiments and modifications that does not depart from the spirit of the present invention are also included in the present invention. The following describes such modifications of the display panel 100.

Figure 15:
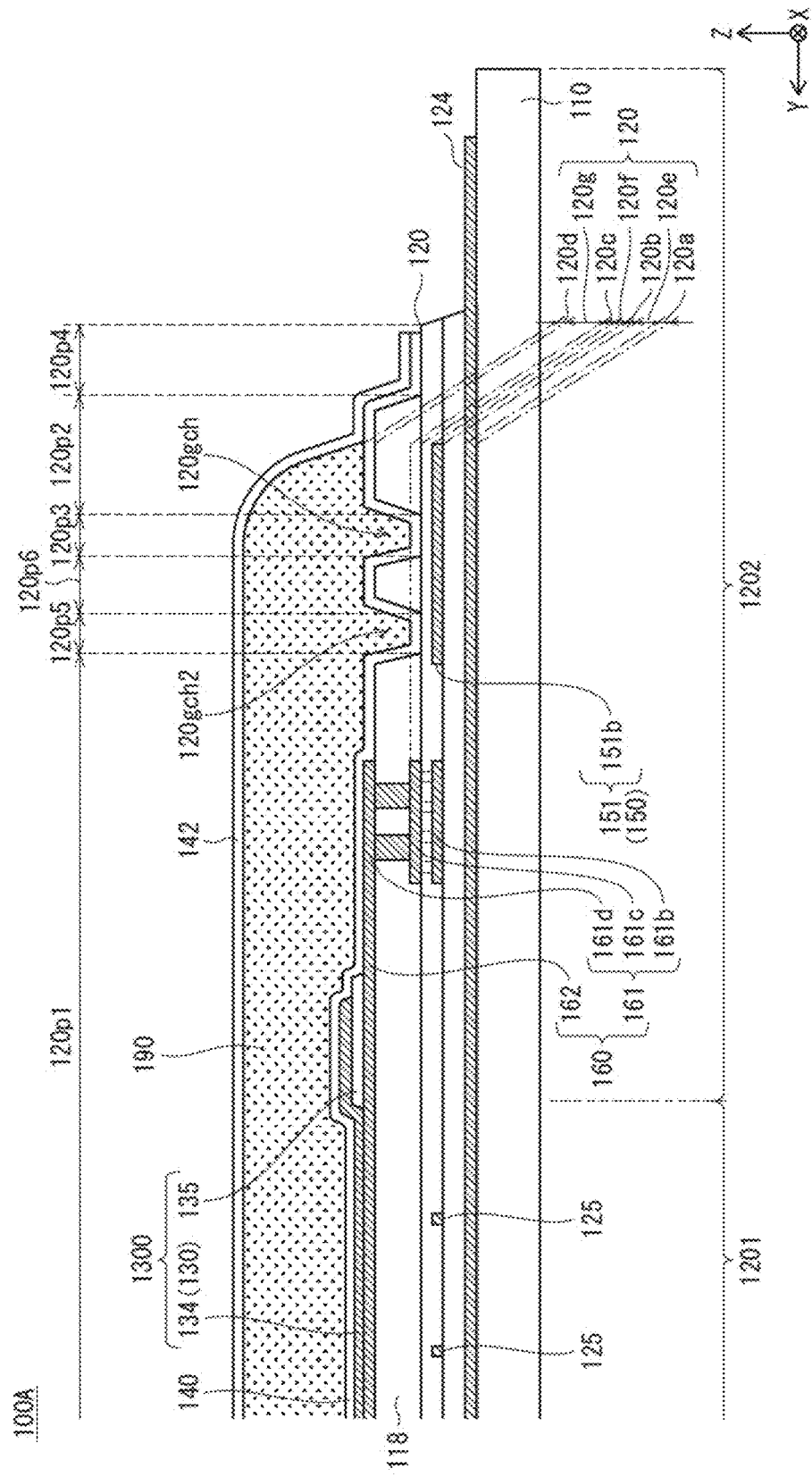
FIG. 15 is a partial cross-sectional view of a peripheral region of a display panel 100A pertaining to at least one embodiment, showing a cross-section corresponding to the cross-section taken along line Y2-Y2 in FIG. 3 and FIG. 4.

(1) FIG. 15 is a partial cross-sectional view of a peripheral region of a display panel 100A pertaining to Modification 1 that is one embodiment of the present disclosure, showing a cross-section corresponding to the cross-section taken along line Y2-Y2 in FIG. 3 and FIG. 4.

In the display panel 100 pertaining to the above embodiment, as illustrated in FIG. 4, FIG. 5, and FIG. 6, the multi-layered wiring laminate 120 has a circumferential groove portion 120gch having a groove structure formed by removing the interlayer insulating layer 120g in the peripheral region portion 1202, which surrounds the display region portion 1201 in which the organic EL element array 1300 is arranged. The display panel 100A pertaining to Modification 1 differs from the display panel 100 in that the multi-layered wiring laminate 120 further includes, in the peripheral region portion 1202, a circumferential groove portion 120gch2 having a groove structure formed by removing the interlayer insulating layer 120g inside the circumferential groove portion 120gch in plan view. Specifically, in the display panel 100A pertaining to Modification 1, in addition to the components of the display panel 100 pertaining to the above embodiment, the multi-layered wiring laminate 120 further includes: a fifth part 120p5 that, in plan view, surrounds the first part 120p1 and is inside the third part 120p3; and a sixth part 120p6 that, in plan view, surrounds the fifth part 120p5 and is inside the third part 120p3. The fifth part 120p5 is not covered by the resin insulating layer 120g, and the sixth part 120p6 is covered by the resin insulating layer 120g. The fifth part 120p5 preferably has, for example, a width from 100 μm to 200 μm. In the present embodiment, the width of the fifth part 120p5 is approximately 150 μm.

Because the display panel 100A has two circumferential groove portions 120gch and 120gch2 in the peripheral region portion 1202, even when moisture penetrates from the substrate outer peripheral direction into a portion of the interlayer insulating layer 120g inside the circumferential groove portion 120gch in plan view (sixth part 120p6), the circumferential groove portion 120gch2 helps to prevent moisture from penetrating further inside in plan view, and thus helps to prevent moisture penetration into the display region portion 1201.

Figure 16:
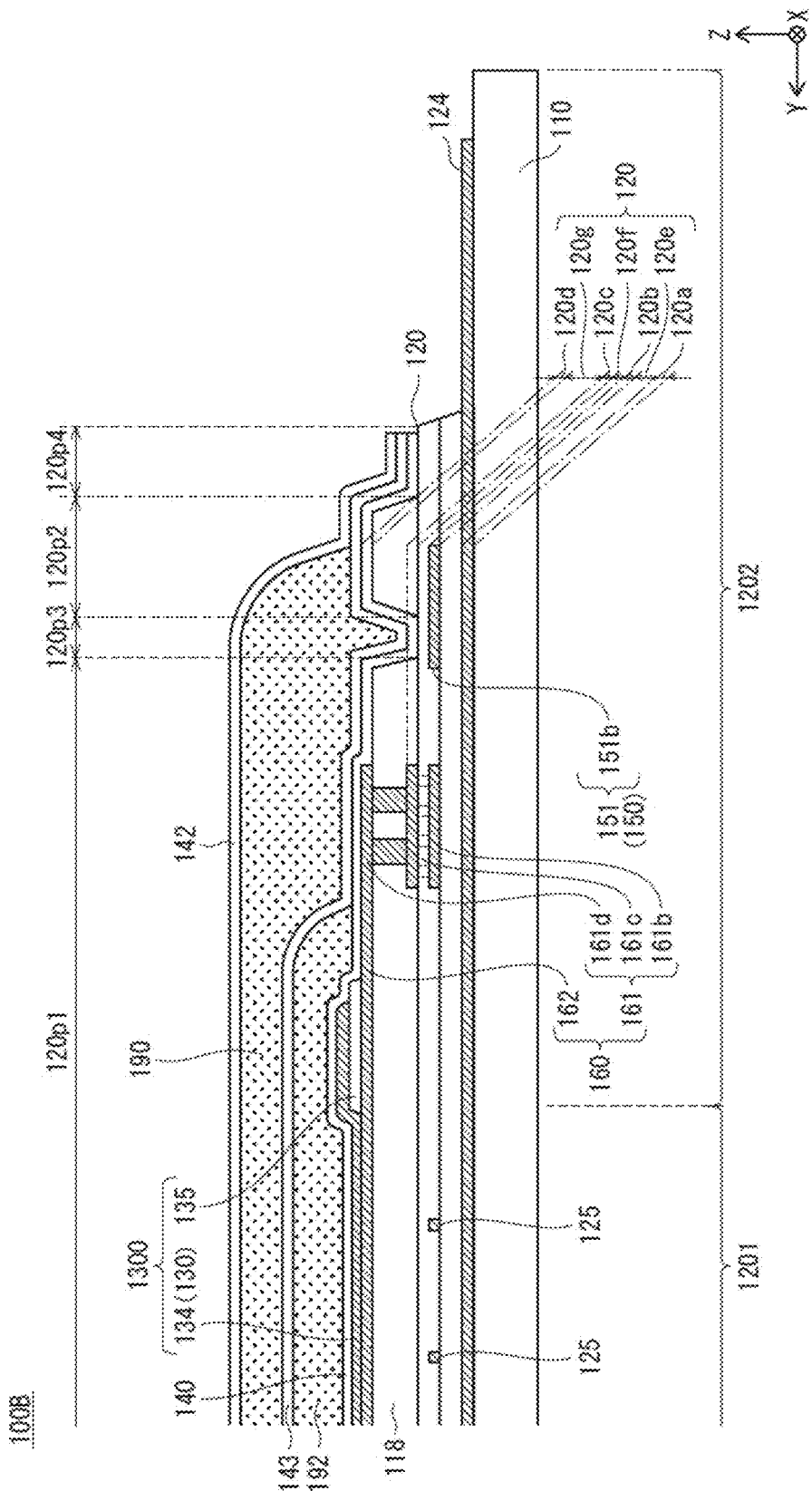
FIG. 16 is a partial cross-sectional view of a peripheral region of a display panel 100B pertaining to at least one embodiment, showing a cross-section corresponding to the cross-section taken along line Y2-Y2 in FIG. 3 and FIG. 4.

(2) FIG. 16 is a partial cross-sectional view of a peripheral region of a display panel 100B pertaining to Modification 2 that is one embodiment of the present disclosure, showing a cross-section corresponding to the cross-section taken along line Y2-Y2 in FIG. 3 and FIG. 4.

In the display panel 100 pertaining to the above embodiment, as illustrated in FIG. 4, FIG. 5, and FIG. 6, by sandwiching the resin sealing layer 190 between the inorganic insulating layer 140 and the inorganic insulating layer 142 and joining the inorganic insulating layer 140 and the inorganic insulating layer 142 around the resin sealing layer 190, the resin sealing layer 190 is enclosed in a packet-shaped structure formed by the inorganic insulating layer 140 and the inorganic insulating layer 142, which are inorganic layers. Further, the inorganic insulating layer 140 and the inorganic insulating layer 142 are joined to each other on the second part 120p2 of the multi-layered wiring laminate 120, which is outside the circumferential groove portion 120gch in the third part 120p3 of the multi-layered wiring laminate 120 in plan view. The display panel 100B pertaining to Modification 2 is characterized in that an inorganic insulating layer 143 and a second resin sealing layer 192 are below the resin sealing layer 190 in a cross-sectional view and that the second resin sealing layer 192 is enclosed in a packet-shaped structure formed by the inorganic insulating layer 140 and the inorganic insulating layer 143, which are inorganic layers. Specifically, in addition to the components of the display panel 100 pertaining to the above embodiment, the display panel 100B pertaining to Modification 2 includes: an upper layer 143 and a lower layer 140 in the inorganic insulating layer 140; and above the organic EL element array 1300 on the first part 120p1, the second resin sealing layer 192 between the upper layer 143 and the lower layer 140. Further, as illustrated in FIG. 16, the inorganic insulating layer 140 and the inorganic insulating layer 143 are joined to each other on the first part 120p1 inside the circumferential groove portion 120gch in plan view. Further, the inorganic insulating layer 140 and the inorganic insulating layer 143 may also be joined to each other outside the circumferential groove portion 120gch on the third part 120p3.

Due to this structure, in the display panel 100B, even when the inorganic insulating layers 140, 143, or 142 having a film flaw is formed due to a foreign material in a lower layer, the triple-layered structure in which the inorganic insulating layers 140, 143, and 142 are laminated helps to prevent moisture penetration from outside. Due to including a laminate of the inorganic insulating layers 140, 143, and 142, which are not formed at the same time, even when one of the inorganic insulating layers 140, 143, and 142 has a film flaw, the other two of the inorganic insulating layers 140, 143, and 142 help to maintain sealing property of the display panel 100.

(3) Other Modifications

In a display panel pertaining to the above embodiment, the light-emitting layer continuously extends in a column direction on a row bank. However, in the above-described structure, the light-emitting layer may be separate on the row bank to correspond one-to-one with the pixels.

According to the display panel pertaining to the above embodiment, there are three colors of the pixels: red pixels, green pixels, and blue pixels, but the present invention is not limited to this example. For example, there may be only one color of light-emitting layer, or there may be four colors of light-emitting layer such as red, green, blue, and yellow.

Further, according to the above embodiment, pixel units are arranged in a matrix, but the present invention is not limited to this example. For example, when the pixel regions are spaced at one pitch, the effects of the present invention are achieved even when the pixel regions are shifted by a half pitch in the column direction between adjacent gaps. In high definition display panels, visually distinguishing slight shifts in the column direction is difficult even if film thickness unevenness on a straight line (or staggered line) having a certain width is lined up, as the shifts in the column direction are visually recognized as a band shape. Accordingly, improving display quality of a display panel, suppressing luminance unevenness, by using a staggered line arrangement is possible.

Further, according to the above embodiment, the hole injection layers, the hole transport layers, the light-emitting layers, and the electron transport layer are disposed between the pixel electrodes and the common electrode, but the present invention is not limited to this example. For example, a structure in which the hole injection layers, the hole transport layers, and the electron transport layer are not used and only the light-emitting layers are present between the pixel electrodes and the common electrode is possible. Further, for example, a structure may be used in which hole injection layers, hole transport layers, an electron transport layer, an electron injection layer, or the like is present, and a structure may be used in which some or all of these layers are present. Further, at least one of these layers may not necessarily be made of organic compounds, and a structure may be used in which an inorganic compound is used.

Further, according to the above embodiment, a wet film-forming process such as printing, spin coating, inkjets, or the like is used as a process of forming the light-emitting layers, but the present invention is not limited to this example. For example, a dry process can be used such as vacuum deposition, electron beam deposition, sputtering, reactive sputtering, ion plating, a vapor phase growth process, or the like. Further, publicly-known materials may be appropriately used as materials of each component.

Further, according to the above embodiment, a structure is used in which pixel electrodes, which are anodes in a lower portion of an EL element unit, are connected to TFT sources, but a structure may be used in which a common electrode layer is in the lower portion of an EL element unit and an anode is disposed in an upper portion. In such a case, a cathode disposed in a lower portion is connected to a drain of the TFT.

Further, according to the above embodiment, a structure is used in which two transistors $Tr_1$ and $Tr_2$ are provided for a subpixel, but the present invention is not limited to this example. For example, a structure may be used in which a single transistor is provided for a subpixel; alternatively, a structure may be used in which three transistors or more are provided for a subpixel.

Further, according to the above embodiment, a top-emission type of EL display panel is given as an example, but the present invention is not limited to this. For example, a bottom-emission type of display panel or the like can be used. In such a case, each structure can be changed appropriately.

Embodiments and modifications described show examples of the present invention. Values, shapes, materials, components, component positions and connections, processes, process order, and the like illustrated by the embodiments and modifications do not indicate limitations of the present invention. Further, among the elements of the embodiments, processes not described in the independent claims that recite top level concepts of the present invention are described as elements of a more preferable embodiment.

Further, the order of processes described above are examples for describing the present invention in detail, and may be different from the order described above. Further, a part of the processes described above may be executed simultaneously (in parallel) with another process.

Further, in order to facilitate understanding of the present invention, scale of the elements in each of the drawings mentioned for the embodiment above may be different from actual scale. Further, the present invention is not limited by the description of the embodiment, and can be appropriately changed without departing from the scope of the present invention.

Further, at least part of the functions of the embodiments and various modifications thereof may be combined.

Further, the present invention includes various modifications of the embodiments that may be conceived of by a person having ordinary skill in the art.

Although one or more embodiments pertaining to the present disclosure have been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. An organic electroluminescence (EL) display panel, comprising:
    a substrate;
    a multi-layered wiring laminate disposed on the substrate and including wiring and a plurality of insulating layers, the wiring disposed on at least one of the insulating layers and extending to a vicinity of an outer periphery of the multi-layered wiring laminate;
    an organic EL element array disposed on the multi-layered wiring laminate and including organic EL elements that are connected to the wiring;
    a first inorganic insulating layer disposed at least on the organic EL element array and extending outside the outer periphery of the multi-layered wiring laminate in plan view;
    a resin sealing layer disposed on the first inorganic insulating layer, the resin sealing layer covering the organic EL element array in plan view and having an outer periphery above a resin insulating layer that is a highest layer among the insulating layers; and
    a second inorganic insulating layer disposed at least on the resin sealing layer, the second inorganic insulating layer extending outside the outer periphery of the resin sealing layer in plan view and being in contact with the first inorganic insulating layer in a thickness direction.

2. The organic EL display panel of claim 1, wherein the second inorganic insulating layer extends outside the outer periphery of the multi-layered wiring laminate in plan view and is in contact with the first inorganic insulating layer above the substrate.

3. The organic EL display panel of claim 1, wherein the multi-layered wiring laminate includes:
    a first part on which the organic EL element array is disposed and in which a first portion of the resin insulating layer is present;
    a second part that surrounds the first part in plan view and in which a second portion of the resin insulating layer having a bank-shape is present;
    a third part that is between the first part and the second part in plan view and that has a shape of a circumferential groove in which the resin insulating layer is not present; and
    a fourth part that surrounds the second part and in which the resin insulating layer is not present, wherein
    the wiring extends from the first part to the fourth part in plan view,
    the outer periphery of the resin sealing layer is in the second part in plan view, and the first inorganic insulating layer and the second inorganic insulating layer extend to the fourth part in plan view and are in contact with each other outside the outer periphery of the resin sealing layer.

4. The organic EL display panel of claim 3, wherein the multi-layered wiring laminate further includes:
a fifth part that is not covered by the resin insulating layer, the fifth part surrounding the first part and being surrounded by the third part in plan view; and
a sixth part that is covered by the resin insulating layer, the sixth part surrounding the fifth part and being surrounded by the third part in plan view.

5. The organic EL display panel of claim 1 further comprising
a second resin sealing layer, wherein
the first inorganic insulating layer includes an upper layer and a lower layer, and
the second resin sealing layer is disposed between the upper layer and the lower layer above the organic EL element array in the first part of the multi-layered wiring laminate.

6. The organic EL display panel of claim 1, wherein the organic EL elements each include:
a light-emitting unit that includes a pixel electrode, a common electrode opposing the pixel electrode, and an organic light-emitting layer sandwiched between the pixel electrode and the common electrode; and
a transistor that is connected to the pixel electrode and that drives the light-emitting unit, and
the wiring is connected to: the common electrode; or sources, drains, gates, or power lines of the transistors of the organic EL elements.

7. The organic EL display panel of claim 1, wherein in the first part of the multi-layered wiring laminate, the first inorganic insulating layer covers the organic EL element array, the wiring, and the resin insulating layer.

8. The organic EL display panel of claim 1, wherein the substrate is a film including a flexible material.

9. The organic EL display panel of claim 1, wherein the substrate is light-transmissive.

* * * * *